(12) United States Patent
Tanaka et al.

(10) Patent No.: US 10,317,761 B2
(45) Date of Patent: Jun. 11, 2019

(54) LIQUID CRYSTAL DISPLAY DEVICE

(71) Applicant: Japan Display Inc., Minato-ku (JP)

(72) Inventors: Yukio Tanaka, Minato-ku (JP); Daiichi Suzuki, Minato-ku (JP); Takashi Nakamura, Minato-ku (JP); Masahiro Tada, Minato-ku (JP); Youichi Asakawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 208 days.

(21) Appl. No.: 15/172,829

(22) Filed: Jun. 3, 2016

(65) Prior Publication Data

US 2016/0363796 A1    Dec. 15, 2016

(30) Foreign Application Priority Data

Jun. 9, 2015 (JP) .................................. 2015-116572

(51) Int. Cl.
| | |
|---|---|
| *G02F 1/1368* | (2006.01) |
| *G02F 1/1362* | (2006.01) |
| *H01L 27/12* | (2006.01) |
| *H01L 29/417* | (2006.01) |
| *H01L 29/786* | (2006.01) |

(52) U.S. Cl.
CPC ...... *G02F 1/1368* (2013.01); *G02F 1/136209* (2013.01); *H01L 27/124* (2013.01); *H01L 27/1222* (2013.01); *H01L 29/41733* (2013.01); *H01L 29/78633* (2013.01); *H01L 29/78645* (2013.01); *H01L 29/78696* (2013.01); *H01L 29/7869* (2013.01)

(58) Field of Classification Search
CPC ............. G02F 1/1368; G02F 1/136209; H01L 27/1222

See application file for complete search history.

(56) References Cited

U.S. PATENT DOCUMENTS

2015/0154932 A1* 6/2015 Lee ...................... G09G 3/3655
345/206

FOREIGN PATENT DOCUMENTS

WO    WO 2013/190912 A1    12/2013

* cited by examiner

*Primary Examiner* — Lucy P Chien
(74) *Attorney, Agent, or Firm* — Oblon, McClelland, Maier & Neustadt, L.L.P.

(57) ABSTRACT

A liquid crystal display device according to an aspect of the invention includes a display region having a plurality of sub pixels. The sub pixels each include a pixel electrode and a thin film transistor electrically coupled to the pixel electrode. A transient leak current of each thin film transistor included in the sub pixels at both ends of the display region among the sub pixels provided on a line passing through the center of the display region in plan view is smaller than a transient leak current of each thin film transistor included in the sub pixels in a central portion including the center.

10 Claims, 19 Drawing Sheets

LIQUID CRYSTAL DISPLAY DEVICE

CROSS-REFERENCE TO RELATED APPLICATIONS

This application claims priority from Japanese Application No. 2015-116572, filed on Jun. 9, 2015, the contents of which are incorporated by reference herein in its entirety.

BACKGROUND

1. Technical Field

The present disclosure relates to a liquid crystal display device.

2. Description of the Related Art

As a technique to reduce power consumption of liquid crystal display devices, low frequency driving and intermittent driving have been proposed. The low frequency driving and the intermittent driving are driving methods that reduce the number of rewriting times of a video signal per unit time (e.g., refer to International Patent Application Laid-open Publication No. 2013-190912).

One of the problems to be solved in such liquid crystal display devices is to reduce a flicker. For example, when a liquid crystal panel is left in a high humidity environment for a long time, external moisture enters a liquid crystal layer from the end portion of the liquid crystal panel, thereby reducing the voltage holding ratio of the liquid crystal layer. The reduction of the voltage holding ratio is large at the end portion of a display region (particularly, at a corner section of the display region). The flicker, thus, easily occurs at the end portion of the display region. The technique disclosed in International Patent Application Laid-open Publication No. 2013-190912 cannot sufficiently reduce the flicker.

SUMMARY

A liquid crystal display device according to an aspect of the invention includes a display region having a plurality of sub pixels. The sub pixels each include a pixel electrode and a thin film transistor electrically coupled to the pixel electrode. A transient leak current of each thin film transistor included in the sub pixels at both ends of the display region among the sub pixels provided on a line passing through the center of the display region in plan view is smaller than a transient leak current of each thin film transistor included in the sub pixels in a central portion including the center.

DETAILED DESCRIPTION

The following describes embodiments of the present invention in detail with reference to the accompanying drawings. The description of the following embodiments does not limit the invention. The constituent elements of the following embodiments include elements easily envisaged by those skilled in the art and identical elements. The constituent elements described below can also be combined as appropriate. The disclosure is made by way of examples. All modifications and changes that may be easily achieved by those skilled in the art within the spirit of the invention are included in the scope of the invention. To explain the drawings clearer, the widths, thicknesses, and shapes of respective components may be more schematically illustrated than the actual ones. Those are illustrated by way of examples and do not limit the interpretation of the invention. In the present specification and the respective drawings, the same elements already described in the previous drawings are labeled with the same symbols and the detailed description thereof may be omitted as appropriate.

First Embodiment

Figure 1:
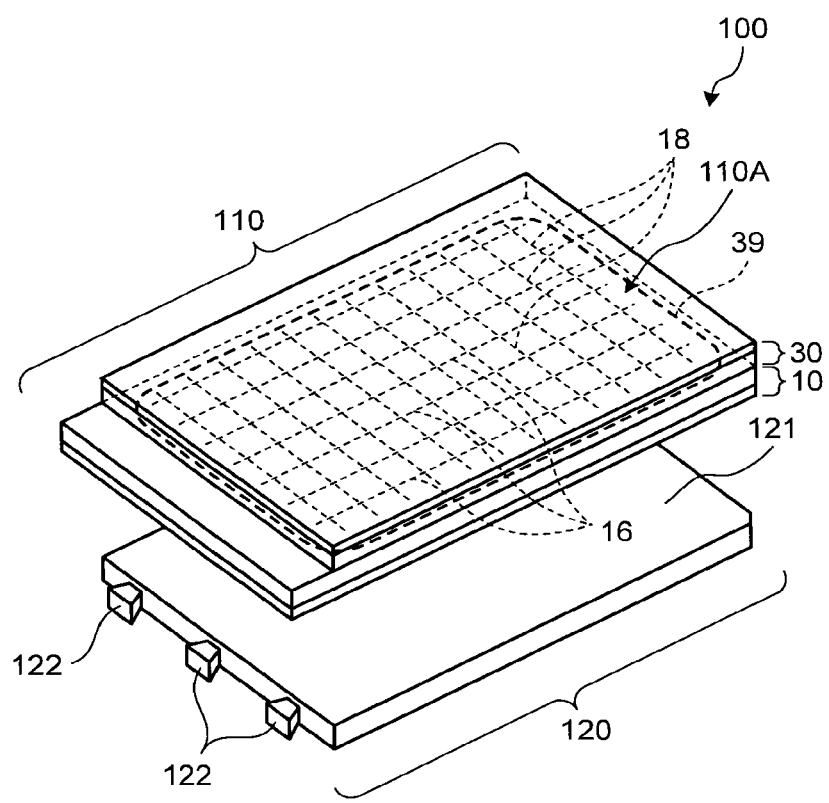
FIG. 1 is a perspective view illustrating a schematic structure of a liquid crystal display device according to a first embodiment.

FIG. 1 is a perspective view illustrating a schematic structure of a liquid crystal display device 100 according to a first embodiment.

The liquid crystal display device 100 includes a liquid crystal panel 110 and a backlight 120. The liquid crystal panel 110 includes a first substrate 10 and a second substrate 30. The second substrate 30 is provided to be opposed to the first substrate 10. A seal material 39 having a frame shape is provided in a periphery of an opposed region where the first substrate 10 faces the second substrate 30. A liquid crystal layer 40 (refer to FIG. 4) is sealed in a space surrounded by the first substrate 10, the second substrate 30, and the seal material 39. A display region 110A is provided in the region surrounded by the seal material 39.

The backlight 120 emits illumination light toward the display region 110A. The backlight 120 includes a light guide plate 121 and a plurality of light sources 122, for example. The light sources 122 are arranged side by side along an end face (light incident surface) of the light guide plate 121. Illumination light emitted from the light sources 122 propagates through the light guide plate 121 while being totally reflected and is emitted from the principal surface of the light guide plate 121 that faces the liquid crystal panel 110. In FIG. 1, a side light structure is employed for the backlight 120. The structure of the backlight 120 is, however, not limited to the example. For example, a backlight may be employed that has a structure where a plurality of point-shaped light sources is arranged directly under the liquid crystal panel 110.

Figure 2:
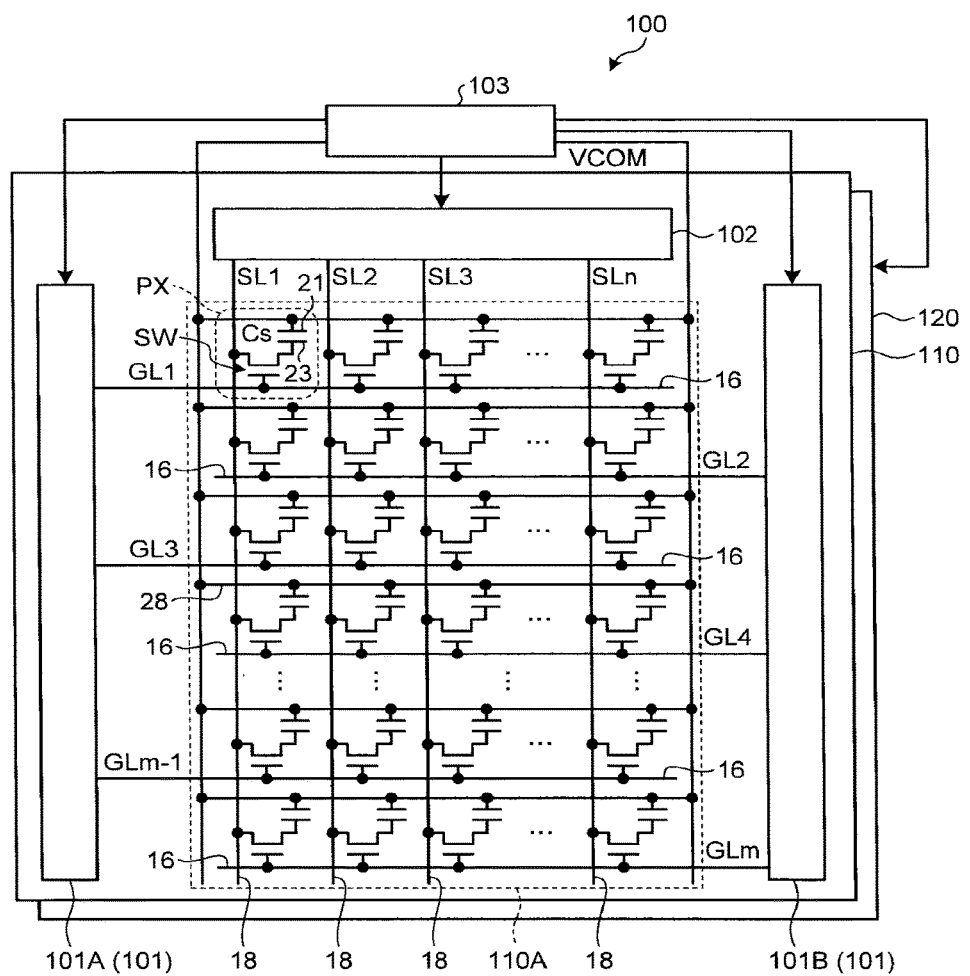
FIG. 2 is a schematic diagram illustrating an electrical structure of the liquid crystal display device.

FIG. 2 is a schematic diagram illustrating an electrical structure of the liquid crystal display device 100.

In the display region 110A, a plurality of scan lines 16 and a plurality of signal lines 18 are provided so as to intersect with each other. A thin film transistor SW is provided at each intersection between the scan line 16 and the signal line 18. A gate electrode of the thin film transistor SW is electrically coupled to the scan line 16. A source electrode of the thin film transistor SW is electrically coupled to the signal line 18. A drain electrode of the thin film transistor SW is electrically coupled to a pixel electrode 23.

A common electrode 21 shared by the pixel electrodes is provided in the display region 110A. An orientation of the liquid crystal layer 40 (refer to FIG. 4) is controlled by an electric field generated between the pixel electrode 23 and the common electrode 21. A region where the orientation of the liquid crystal layer 40 is controlled by the single pixel electrode 23 and the common electrode 21 is a single sub pixel PX. The display region 110A is formed by a plurality of the sub pixels PX arranged in a matrix along the extending directions of the scan lines 16 and the signal lines 18.

As a drive unit that drives the sub pixels PX, a gate driver 101 and a source driver 102 are provided. The scan lines 16 are electrically coupled to the gate driver 101. The signal lines 18 are electrically coupled to the source driver 102. The gate driver 101 includes a first gate driver 101A and a second gate driver 101B. The scan lines 16 are coupled to two gate drivers 101 (the first gate driver 101A and the second gate driver 101B) in such a manner that they are alternately coupled to the first gate driver 101A and the second gate driver 101B one by one. The gate driver 101 and the source driver 102 are arranged in a region surrounding the display region 110A, for example.

The gate driver 101 sequentially selects the scan lines 16 in the order of GL1, GL2, GL3, GL4, . . . , GLm−1, and GLm in a single vertical scan period. The gate driver 101 supplies a gate signal to the selected scan line 16 so as to supply an on voltage to the gate electrodes of the thin film transistors SW coupled to the scan line 16. It is preferable that the on voltages supplied to the respective scan lines are the same. The source driver 102 simultaneously or sequentially selects the signal lines 18 of SL1, SL2, SL3, . . . , SLn in a single horizontal scan period. The source driver 102 supplies a video signal to the selected signal line 18. The video signal is supplied to the source electrode of the thin film transistor SW coupled to the signal line 18 and supplied to the pixel electrode 23 via a channel section and the drain electrode of the thin film transistor SW.

The operation of the gate driver 101 and the source driver 102 is controlled by a control circuit 103 provided outside the liquid crystal panel 110. The control circuit 103 supplies a common voltage VCOM to the common electrode 21 via common signal lines 28. The control circuit 103 controls the operation of the backlight 120.

The control circuit 103 changes the number of rewriting times of the video signal per unit time in accordance with the displayed image. When a still image in which importance is not attached to moving image visibility is displayed, for example, the control circuit 103 performs low frequency driving or intermittent driving. The low frequency driving is a drive system that reduces power consumption by reducing a drive frequency of the liquid crystal display device 100 to ½ or ¼ of a standard condition, for example. The intermittent driving is a drive system that reduces power consumption by setting a pause period of several display periods after the liquid crystal display device 100 performs writing in a display period. Both drive systems may cause the occurrence of adverse reaction such as a moving image blur since a video signal rewriting cycle becomes longer. Each of the drive systems is, however, effective for power consumption reduction in displaying still images in which importance is not attached to the moving image visibility.

In the specification, a time interval in which the video signal is rewritten is called a "frame period" or "single frame" and a reciprocal of the frame period is called a "frame frequency" in relation to the low frequency driving and the intermittent driving.

For example, it is assumed that a standard frame frequency is 60 Hz (i.e., the video signal is rewritten every sixteenth of a second). When the moving image is displayed, the control circuit 103 performs rewriting of the video signal at a standard 60 Hz. When a still image in which importance is not attached to moving image visibility is displayed, the control circuit 103 performs writing in ¹⁄₆₀ sec, and thereafter sets a pause period of ¹⁄₆₀, ³⁄₆₀, ⁷⁄₆₀, or ⁵⁹⁄₆₀ sec, for example. The operation of the control circuit 103 stops during the pause period. As a result, power consumption, which is a temporal average in a total period including the writing period and the pause period, is reduced.

When a DC voltage is applied to a liquid crystal material for a long time, a temporal change occurs in display characteristics by charge-up. The driving is, thus, generally performed by inversing the polarity of the video signal for every frame such that an average of a DC voltage is substantially zero. If a response characteristic (luminance-voltage characteristic) differs between the positive polarity frame and the negative polarity frame, the positive polarity frame and the negative polarity frame have different luminance, thereby causing brightness and darkness to vary in each frame. As a result, a flicker occurs. The flicker can be minimized by adding a minute offset voltage to an average of the positive polarity and the negative polarity video signals (average of the DC voltages) or adjusting common potential. It is, however, difficult to completely eliminate the flicker by completely absorbing a temporal shift of the luminance-voltage characteristic and a difference between gradations in optimum condition, for example.

For reducing the flicker, the control circuit 103 performs inversion such as line inversion, column inversion, or dot inversion. For example, the line inversion can cause the flicker not to be apparent by inverting phases of temporal polarity inversion row by row so as to macroscopically cancel a difference in luminance response between polarities. The column inversion and the dot inversion can cause the flicker not to be apparent in the similar manner as the line conversion. The column inversion inverses the phases of the polarity inversion column by column. The dot inversion inverses the phases of the polarity inversion in a checkerboard pattern (i.e., phases of the polarity inversion are inversed row by row and column by column).

The line inversion and the dot inversion perform writing to the pixels while performing polarity inversion line by line in screen scan. Charging and discharging of the signal lines in the panel need to be performed every H period (horizontal period). As a result, power consumption is increased. In contrast, the column inversion performs no polarity inversion in rows. The column inversion is, thus, advantageous in view of reduction of power consumption. Various inversion methods are employed in a mobile liquid crystal display device in accordance with a product specification. The column inversion method is the most desirable in view of reduction of power consumption.

Figure 3:
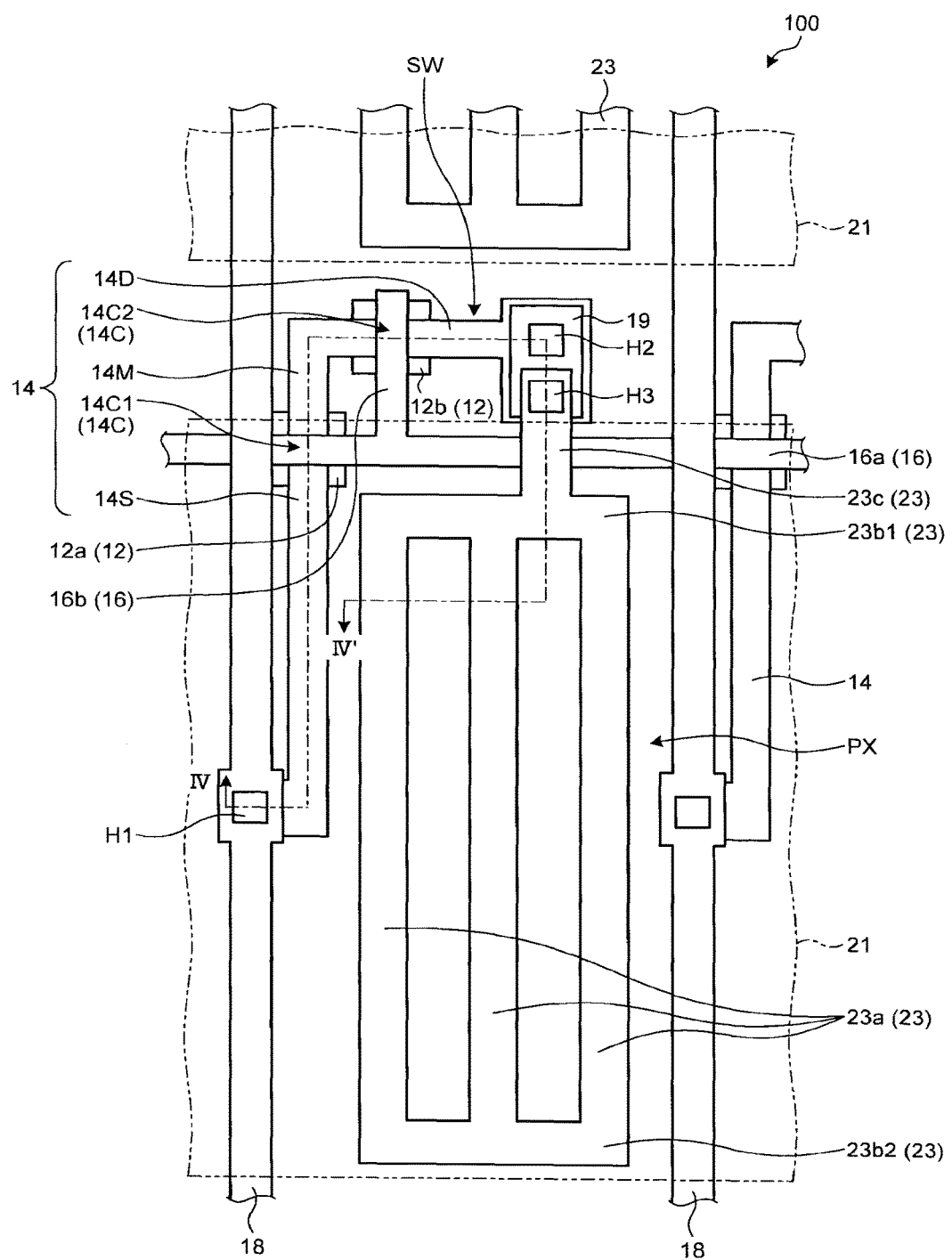
FIG. 3 is a plan view of a first substrate for explaining the structure of a sub pixel.
Figure 4:
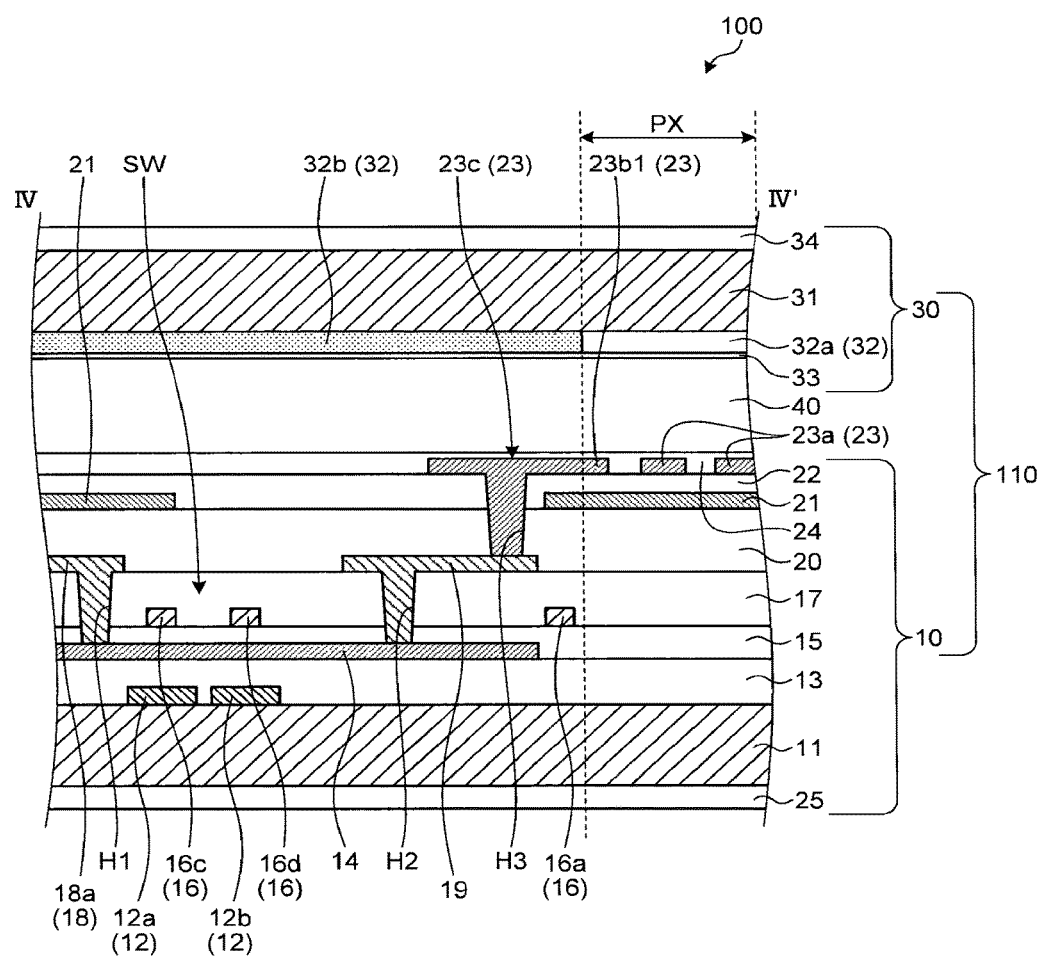
FIG. 4 is a sectional view along line IV-IV' of FIG. 3.
Figure 5:
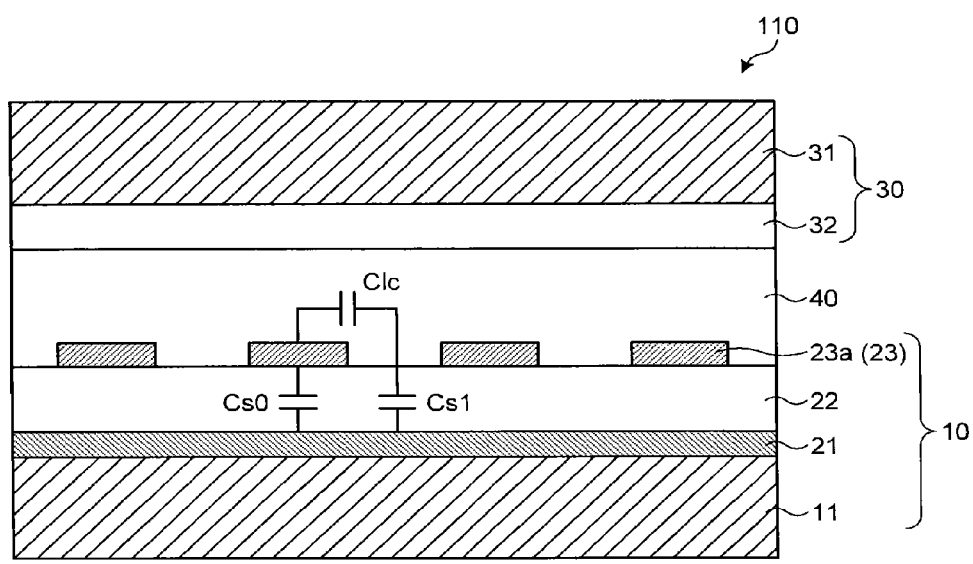
FIG. 5 is a schematic diagram illustrating coupling capacitance between a pixel electrode and a common electrode.

FIG. 3 is a plan view of the first substrate for explaining the structure of the sub pixel PX. FIG. 4 is a sectional view along line IV-IV' of FIG. 3. FIG. 5 is a schematic diagram illustrating coupling capacitance between the pixel electrode 23 and the common electrode 21.

As illustrated in FIG. 3, the pixel electrode 23 and the common electrode 21 are provided so as to partially overlap with each other in the sub pixel PX. The longitudinal direction of the pixel electrode 23 is the extending direction of the signal lines 18. The common electrode 21 is provided in a belt-like shape along the extending direction of the scan lines 16 so as to cross over a plurality of the pixel electrodes 23 arranged in the extending direction of the scan lines 16.

The pixel electrode 23 has a plurality of belt-like electrodes 23a, a first joining section 23b1, a second joining section 23b2, and a contact section 23c. Each of the belt-like electrodes 23a extend in the extending direction of the signal lines 18. The belt-like electrodes 23a are provided so as to be arranged in the extending direction of the scan lines 18. The first joining section 23b1 joins one ends of the belt-like electrodes 23a. The second joining section 23b2 joins the other ends of the belt-like electrodes 23a. The contact section 23c branches from the first joining section 23b1 toward the scan line 16. The contact section 23c is electrically coupled to a drain electrode 19 of the thin film transistor SW via a contact hole H3 at a position beyond the scan line 16.

The pixel electrode 23 may be formed in a platy shape without being patterned in a belt-like shape. In this case, the common electrode 21 includes a single or a plurality of belt-shaped electrodes, for example. In the example illustrated in FIG. 3, the pixel electrode 23 is disposed on the upper layer side (a side near the liquid crystal layer) than the common electrode 21. The common electrode 21 may be disposed on the upper layer side than the pixel electrode 23. The common electrode 21 and the pixel electrode 23 may be adjacently arranged side by side on the same layer. The common electrode 21 and the pixel electrode 23 each may be formed in a belt-like shape and provided such that they are apart from each other with a distance therebetween and do not overlap with each other in plan view, for example.

The scan lines 16 and the signal lines 18 are provided along gaps between the pixel electrodes 23. The scan line 16 has a main line section 16a that extends in a direction intersecting the signal line 18 and a branched section 16b that branches from the main line section 16a in a direction parallel to the signal line 18. The thin film transistor SW is provided in the vicinity of the intersection of the scan line 16 and the signal line 18.

The thin film transistor SW includes a semiconductor layer 14. One end of the semiconductor layer 14 is provided at a position overlapping with the signal line 18. The one end of the semiconductor layer 14 is electrically coupled to the signal line 18 via a contact hole H1. The section of the signal line 18 electrically coupled to the semiconductor layer 14 serves as a source electrode 18a (refer to FIG. 4) of the thin film transistor SW.

The semiconductor layer 14 bends in an L-shape from a position overlapping with the signal line 18, and extends along the signal line 18 toward the scan line 16. The semiconductor layer 14 bends in a direction parallel to the scan line 16 at a position beyond the scan line 16, and extends to a position beyond the branched section 16b. The other end of the semiconductor layer 14 is electrically coupled to the drain electrode 19 via a contact hole H2 at the position beyond the branched section 16b.

The semiconductor layer 14 intersects with the main line section 16a and the branched section 16b. The section of the main line section 16a interesting with the semiconductor layer 14 serves as a first gate electrode 16c (refer to FIG. 4) of the thin film transistor SW. The section of the branched section 16b intersecting with the semiconductor layer 14 serves as a second gate electrode 16d (refer to FIG. 4) of the thin film transistor SW.

The semiconductor layer 14 includes a first channel section 14C1 that faces the first gate electrode 16c, a second channel section 14C2 that faces the second gate electrode 16d, a source section 14S provided between the first channel section 14C1 and the source electrode 18a (refer to FIG. 4), a drain section 14D provided between the second channel section 14C2 and the drain electrode 19, and an intermediate section 14M provided between the first channel section 14C1 and the second channel section 14C2.

In each of the source section 14S, the drain section 14D, and the intermediate section 14M of the thin film transistor SW, a lightly doped impurity region is provided on a side near the channel section and a highly doped impurity region is provided on a side far from the channel section. The impurity concentration of the lightly doped impurity region is lower than that of the highly doped impurity region.

A light blocking layer 12 is provided on the backlight 120 side (refer to FIG. 4) of the semiconductor layer 14. The light blocking layer 12 blocks light entering the semiconductor layer 14 from the backlight 120. The light blocking layer 12 is provided on a lower layer (a layer on the backlight 120 side) of the thin film transistor SW, for example. The light blocking layer 12 includes a first light blocking layer 12a that overlaps with the first channel section 14C1 and a second light blocking layer 12b that overlaps with the second channel section 14C2. An area of the first light blocking layer 12a is larger than that of the first channel section 14C1. The area of the second light blocking layer 12b is larger than that of the second channel section 14C2. As a result, illumination light toward a channel section 14C from the backlight 120 at various angles is blocked.

As illustrated in FIG. 4, the first substrate 10 includes a platy first base 11. The light blocking layer (the first light blocking layer 12a and the second light blocking layer 12b) is formed on the inner side (on the liquid crystal layer 40 side) of the first base 11. A first interlayer insulating layer 13 is formed on the first base 11 so as to cover the light blocking layer 12. The semiconductor layer 14 is formed on the first interlayer insulating layer 13.

For the material of the semiconductor layer 14, a known material such as polysilicon or an oxide semiconductor can be used. An oxide semiconductor composed of indium (In), gallium (Ga), zinc (Zn), and oxygen (O) can reduce a transient leak current and, thus, has a high ability (holding ability) of holding a voltage for video display for a long time. The oxide semiconductor thus described is effective for reducing the flicker in the intermittent driving. The use of polysilicon has advantages of high mobility and a high aperture ratio.

The semiconductor layer 14 may be formed of amorphous silicon. When the semiconductor layer 14 is formed of amorphous silicon, no lightly doped impurity region and no highly doped impurity region are required.

A gate insulating layer 15 is formed on the first interlayer insulating layer 13 so as to cover the semiconductor layer 14. The scan line 16, the first gate electrode 16c, and the second gate electrode 16d are formed on the gate insulating layer 15. A second interlayer insulating layer 17 is formed on the gate insulating layer 15 so as to cover the scan line 16, the first gate electrode 16c, and the second gate electrode 16d.

The signal line 18, the source electrode 18a, and the drain electrode 19 are formed on the second interlayer insulating layer 17. The source electrode 18a is electrically coupled to the source section 14S (refer to FIG. 3) of the semiconductor layer 14 via the contact hole H1 provided to the second interlayer insulating layer 17 and the gate insulating layer 15. The drain electrode 19 is electrically coupled to the drain section 14D (refer to FIG. 3) of the semiconductor layer 14 via the contact hole H2 provided to the second interlayer insulating layer 17 and the gate insulating layer 15.

A third interlayer insulating layer 20 is formed on the second interlayer insulating layer 17 so as to cover the signal line 18, the source electrode 18a, and the drain electrode 19. The common electrode 21 is formed on the third interlayer insulating layer 20. A capacitance insulating layer 22 is formed on the third interlayer insulating layer 20 so as to cover the common electrode 21. The pixel electrode 23 is formed on the capacitance insulating layer 22. The pixel electrode 23 is electrically coupled to the drain electrode 19 via the contact hole H3 provided to the capacitance insulating layer 22 and the third interlayer insulating layer 20. A first orientation film 24 is formed on the capacitance insulating layer 22 so as to cover the pixel electrode 23. A first polarizing plate 25 is adhesively bonded on the outer surface side (a side opposite the liquid crystal layer 40) of the first base 11.

As illustrated in FIG. 5, a capacitance component Cs0 is formed in a region where the pixel electrode 23 and the common electrode 21 face each other with the capacitance insulating layer 22 interposed therebetween. The capacitance component Cs0 serves as a holding capacitor that holds a video display voltage applied between the pixel electrode 23 and the common electrode 21. In a region where the pixel electrode 23 and the common electrode 21 do not face each other, an electric field is generated across a region from the common electrode 21 through the capacitance insulating layer 22 and the liquid crystal layer 40 to the pixel electrode 23. The orientation of the liquid crystal layer 40 is controlled by the electric field. Letting capacitance components in the capacitance insulating layer 22 and the liquid crystal layer 40 formed along the electric field denote a capacitance component Cs1 and a capacitance component Clc, respectively, the total capacitance component including the capacitance components Cs1 and Clc serves as a capacitance component Cs (refer to FIG. 2) between the pixel electrode 23 and the common electrode 21.

Referring back to FIG. 4, the second substrate 30 includes a platy second base 31. A color filter layer 32, an overcoat layer (not illustrated), and a second orientation film 33 are sequentially formed on the inner side (on the liquid crystal layer 40 side) of the second base 31. A second polarizing plate 34 is adhesively bonded on the outer surface side (a side opposite the liquid crystal layer 40) of the second base 31.

The color filter layer 32 includes a color filter 32a and a black matrix 32b. The black matrix 32b is formed in a grid shape so as to overlap with the scan line 16, the signal line 18, the semiconductor layer 14, and the light blocking layer 12 (the first light blocking layer 12a and the second light blocking layer 12b). The belt-like electrodes 23a, the first joining section 23b1, and the second joining section 23b2 do not overlap with the black matrix 32b. The region rimmed by the black matrix 32b (the opening of the black matrix 32b) is the sub pixel PX.

Figure 6:
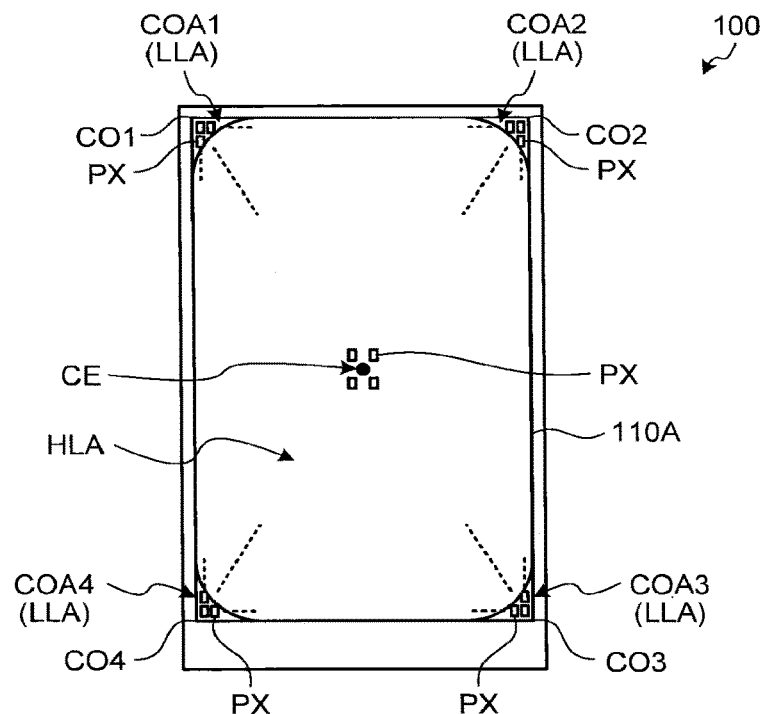
FIG. 6 is a schematic diagram illustrating an exemplary distribution of a transient leak current of a thin film transistor provided to each sub pixel.
Figure 7:
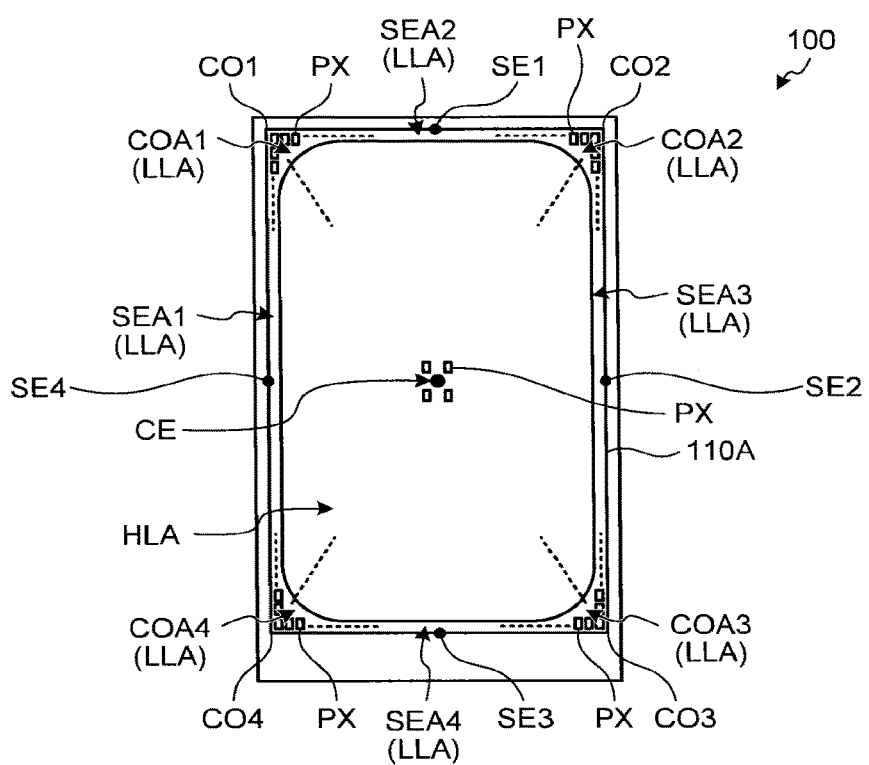
FIG. 7 is a schematic diagram illustrating another exemplary distribution of the transient leak current of the thin film transistor provided to each sub pixel.

FIGS. 6 and 7 are schematic diagrams illustrating exemplary distribution of the transient leak current of the thin film transistor provided to each sub pixel PX. In the specification, a period from the end of the supply of the gate signal (on voltage) to the gate electrode of the thin film transistor to the start of the next supply of the gate signal to the gate electrode is defined as an off period. The transient leak current is a current that flows between the semiconductor layer and the drain electrode of the thin film transistor during the off period.

The distribution of the transient leak current means the distribution of the value of the transient leak current of each sub pixel PX, which is obtained in a state where a voltage difference between the potential of the source electrode and the potential of the gate electrode of the thin film transistor is equalized in all of the sub pixels PX. The value of the transient leak current of each sub pixel PX is obtained by measuring a current that flows between the semiconductor layer and the drain electrode of the thin film transistor when a video signal of a maximum gradation (e.g., a gradation value of 255) is written into the sub pixel PX. Specifically, a voltage signal equivalent to that when a video signal of a maximum gradation (e.g., a gradation value of 255) is written into the sub pixel PX is applied, and the transient leak current flowing in the drain terminal is measured while probes are attached to the source (the signal line), the gate (the scan line), and the drain (the pixel electrode) of the thin film transistor.

As illustrated in FIG. 6, the liquid crystal display device 100 includes the display region 110A including a plurality of the sub pixels PX. Each sub pixel PX includes the pixel electrode and the thin film transistor electrically coupled to the pixel electrode. The display region 110A has a polygonal shape having a plurality of corner sections (a first corner section COA1, a second corner section COA2, a third corner section COA3, and a fourth corner section COA4), for example. In each of the corner sections of the display region 110A, the sub pixels PX are arranged each of which includes the thin film transistor having a transient leak current smaller than that of the thin film transistor included in each of the sub pixels PX located in a central section CE of the display region 110A. The sub pixels PX located in the central section CE means the sub pixels PX provided at the nearest positions from the center of the display region 110A.

The end portion of the display region 110A including the respective corner sections of the display region 110A is a low leak region LLA in which the sub pixels are arranged that include thin film transistors each having a transient leak current smaller than that of the thin film transistor included in each of the sub pixels PX located in the central section CE. In the low leak region LLA, a plurality of the sub pixels PX are arranged. The central portion of the display region 110A including the central section CE of the display region 110A is a high leak region HLA in which the sub pixels are arranged that include thin film transistors each having a transient leak current larger than that of the thin film transistor included in each of the sub pixels PX provided in the low leak region LLA. The high leak region HLA includes at least half the sub pixels PX in the display region 110A, for example. In the display region 110A, the region excluding the low leak region LLA is the high leak region HLA. The border between the low leak region LLA and the high leak region HLA is curved toward the corner at each of the corners (a first corner CO1, a second corner CO2, a third corner CO3, and a fourth corner CO4) of the display region 110A.

In the embodiment, the low leak region LLA is selectively provided to only each corner section of the display region 110A. The position of the low leak region LLA is not limited to the example. As illustrated in FIG. 7, the low leak region LLA may be provided continuously to the whole circumference of the display region 110A. In the example illustrated in FIG. 7, the low leak region LLA is expanded to respective side sections (a first side section SEA1, a second side section SEA2, a third side section SEA3, and a fourth side section SEA4) each connecting the adjacent corner sections.

The following describes a reason why the low leak region LLA is provided to the end portion of the display region 110A.

As illustrated in FIG. 1, the seal material 39 that seals the outer circumference of the liquid crystal layer 40 (refer to FIG. 4) is provided to the periphery of the display region 110A. If a sealability of the seal material 39 is insufficient, moisture enters the liquid crystal layer 40 via interfaces between the seal material 39 and the first substrate 10 and the second substrate 30, for example, when the liquid crystal display device 100 is left in a high temperature and high humidity environment. Even if the sealability of the seal material 39 is sufficient, when the interlayer insulating layers and the overcoat layer of the color filter have moisture permeability, moisture may pass through the layers to enter the liquid crystal layer 40.

When moisture enters the liquid crystal layer 40, a resistance of the liquid crystal layer 40 is reduced, thereby causing the deterioration of the holding characteristic of the liquid crystal layer 40. The absolute value of a video display voltage applied to the liquid crystal layer 40 is attenuated in the off period, thereby reducing luminance of a video image. The reduction of luminance occurs regardless of the polarity of the frame. Although the voltage is averaged between the multiple frames by the dot inversion driving or the column inversion driving, the luminance change remains without being cancelled, thereby causing the occurrence of periodical luminance change (flicker). Particularly, when the frame frequency is smaller than 40 Hz after the low frequency driving or the intermittent driving, the visibility of the flicker becomes high. As a result, the flicker is easily viewed by a user.

The flicker becomes larger at the end portion of the display region 110A near the seal material 39. Particularly, at the corner sections of the display region 110A, the holding ratio is easily reduced because moisture enters the corner section from the two sides adjacent to each other with the corner section therebetween. In the embodiment, the reduction of the holding ability caused by the reduction of the holding ratio of the liquid crystal layer 40 is compensated by increasing the holding ability of the thin film transistors. The thin film transistor having a small transient leak current has a high holding ability of holding the video display voltage. Although a voltage leak occurs via the liquid crystal layer due to the reduction of the holding ratio, the change in voltage is reduced as a whole by reducing the voltage leak via the thin film transistors. As a result, the flicker is hardly viewed even at the end portion of the display region 110A.

Figure 8:
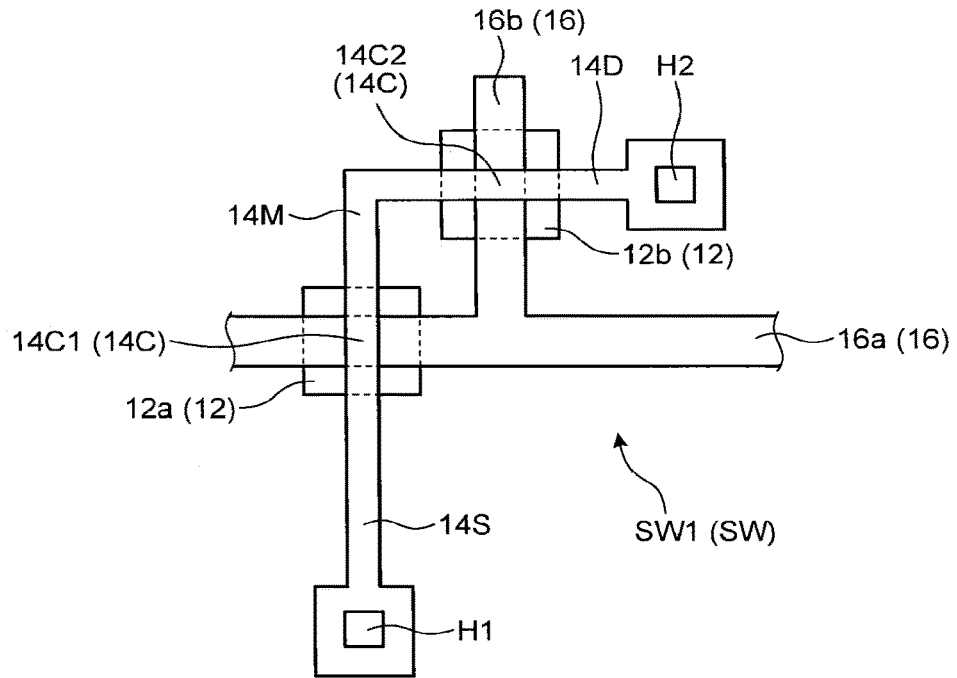
FIG. 8 is a schematic diagram illustrating the thin film transistor provided in a high leak region.
Figure 9:
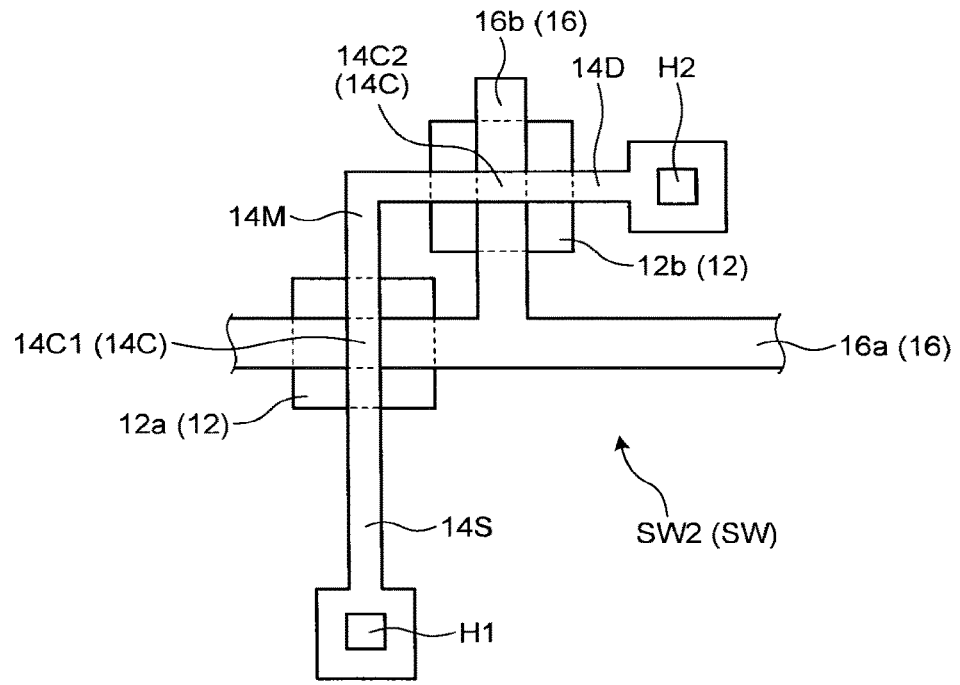
FIG. 9 is a schematic diagram illustrating the thin film transistor provided in a low leak region.

The following describes the structures of the thin film transistors in the central portion and in the end portion in the display region. FIG. 8 is a schematic diagram illustrating the thin film transistor SW provided in the high leak region HLA. FIG. 9 is a schematic diagram illustrating the thin film transistor SW provided in the low leak region LLA. In the following description, the thin film transistor SW provided in the high leak region HLA is described as a first thin film transistor SW1 while the thin film transistor SW provided in the low leak region LLA is described as a second thin film transistor SW2 in some cases.

In the embodiment, the value of the transient leak current of the thin film transistor SW is controlled by the size of the light blocking layer 12. On the backlight 120 side (refer to FIG. 1) of the semiconductor layer 14, the light blocking layer 12 is provided that overlaps with the semiconductor layer 14. As the size of the light blocking layer 12 becomes larger, illumination light from the backlight 120 (refer to FIG. 1) illuminating the display region 110A is blocked more effectively.

Letting an area of the region where the light blocking layer 12 overlaps with the semiconductor layer 14 denote a light blocking area of the thin film transistor SW, the light blocking area of the second thin film transistor SW2 provided in the low leak region is larger than that of the first thin film transistor SW1 provided in the high leak region. When the light blocking layer 12 includes a plurality of separated light blocking layers (a first separated light blocking layer 12a and a second separated light blocking layer 12b) as illustrated in FIGS. 8 and 9, the light blocking area is calculated as the sum of the light blocking areas of the respective separated light blocking layers (the areas of overlaps of the semiconductor layer 14 and the respective separated light blocking layers).

As for the light blocking layer 12 that covers the second thin film transistor SW2, it is preferable that the area of the first separated light blocking layer 12a is larger than that of the second separated light blocking layer 12b. It is preferable that the area of the first separated light blocking layer 12a that covers the second thin film transistor SW2 is larger than that of the first separated light blocking layer 12a that covers the first thin film transistor SW1. The light blocking layer 12 may be integrated without being separated.

As illustrated in FIG. 1, the backlight 120 that illuminates the display region 110A is provided on the rear side of the liquid crystal panel 110. The light blocking layer 12 is provided on the backlight 120 side of the semiconductor layer 14. The light blocking layer 12 blocks illumination light from the backlight 120, thereby reducing the transient leak current. As the light blocking area blocked by the light blocking layer 12 is increased, an amount of illumination light entering the channel section 14C of the thin film transistor SW is reduced, resulting in the transient leak current being smaller. That the transient leak current is small means that the transient leak current of one thin film transistor is smaller than that of the other thin film transistor in a plurality of the thin film transistors in each of which potential Vs of the source electrode and potential Vg of the gate electrode are equal to each other.

Figure 10:
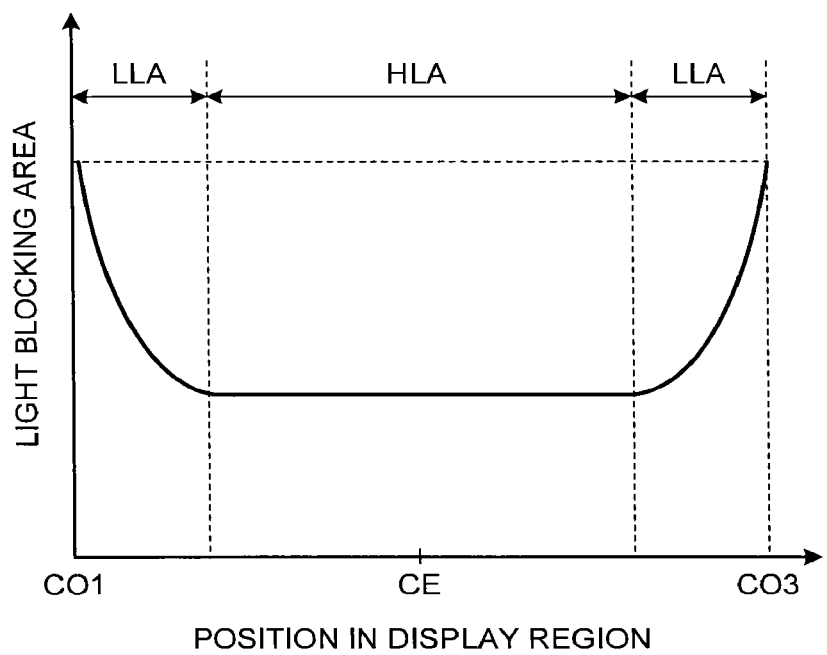
FIG. 10 is a schematic diagram illustrating an exemplary distribution of a light blocking area of the thin film transistor.

FIG. 10 is a schematic diagram illustrating an exemplary distribution of the light blocking area of the thin film transistor in order to achieve the distribution of the transient leak current illustrated in FIG. 6. The abscissa axis of FIG. 10 represents the position of the sub pixel in the display region 110A illustrated in FIG. 6 while the ordinate axis of FIG. 10 represents the light blocking area of the thin film transistor. The position of the sub pixel means the position on a diagonal line of the display region 110A. The diagonal line passes through the first corner CO1, the central section CE, and the third corner CO3, which are illustrated in FIG. 6. Although illustration is omitted, the distribution of the light blocking area along the other diagonal line of the display region 110A, the diagonal line passing through the second corner CO2, the central section CE, and the fourth corner CO4, is the same as that illustrated in FIG. 10.

As illustrated in FIG. 10, in the low leak region LLA, the more the position of the sub pixel close to the outer circumference of the display region, the larger the light blocking area of the thin film transistor is. In the low leak region LLA, therefore, the more the position of the sub pixel close to the outer circumference of the display region, the smaller the transient leak current of the thin film transistor is. In the high leak region HLA, the light blocking area of the thin film transistor is constant regardless of the position of the sub pixel. This structure reduces the luminance change at the border between the low leak region LLA and the high leak region HLA, thereby causing the border to be hardly viewed. In the example illustrated in FIG. 10, the light blocking area is continuously increased as the position of the sub pixel gets closer to the outer circumference of the display region. The distribution of the light blocking area is, however, not limited to the example. For example, the line representing the distribution of the light blocking area may be shaped in a step-like manner as the position of the sub pixel gets closer to the outer circumference of the display region.

In the low leak region LLA, the more the position of the sub pixel close to the outer circumference of the display region, the larger the increasing ratio of the light blocking area is, for example. The increasing ratio of the light blocking area is a ratio of an amount of change in light blocking area to an amount of change in position in the display region. For example, the ratio is a gradient of a tangent to the curve representing the distribution of the light blocking area. In FIG. 10, the line representing the distribution of the light blocking area in the low leak region LLA is the downward convex curve, for example. As a result of the comparison of the light blocking areas of the thin film transistors among the sub pixels, the increasing ratio of the light blocking area in relation to the thin film transistors on a side near the central section CE of the display region 110A is larger than that in relation to the thin film transistors on a side near the end portion of the display region 110A.

Figure 11:
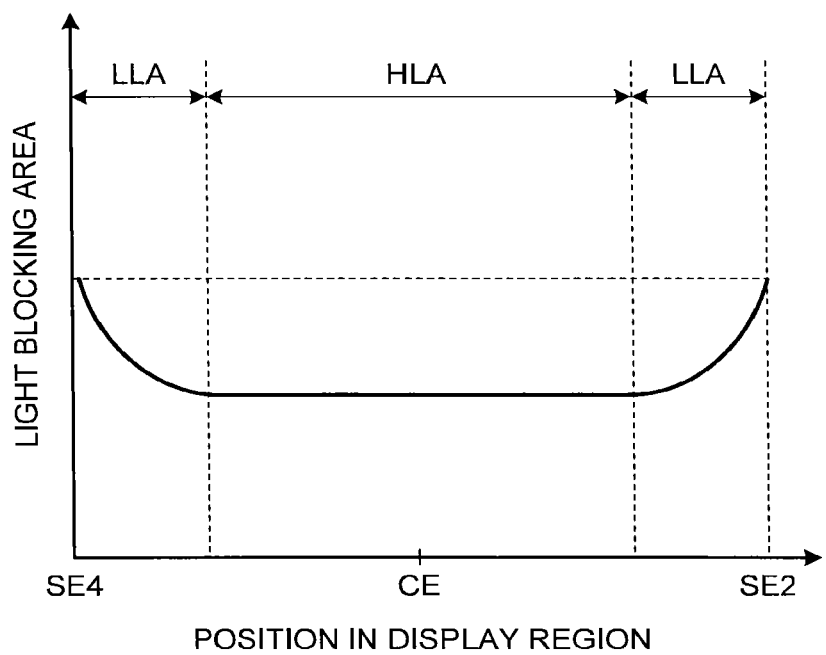
FIG. 11 is a schematic diagram illustrating another exemplary distribution of the light blocking area of the thin film transistor.

FIG. 11 is a schematic diagram illustrating an exemplary distribution of the light blocking area of the thin film transistor in order to achieve the distribution of the transient leak current illustrated in FIG. 7. The abscissa axis of FIG. 11 represents the position of the sub pixel in the display region 110A illustrated in FIG. 7 while the ordinate axis of FIG. 11 represents the light blocking area of the thin film transistor. The position of the sub pixel means the position on a horizontal line of the display region 110A. The horizontal line passes a second midpoint SE2, the central section CE, and a fourth midpoint SE4, which are illustrated in FIG. 7. Although illustration is omitted, the distribution of the light blocking area along a vertical line of the display region 110A, the vertical line passing through a first midpoint SE1, the central section CE, and a third midpoint SE3, is the same as that illustrated in FIG. 11. The distribution of the light blocking area along the diagonal line of the display region 110A is the same as that illustrated in FIG. 10.

The first midpoint SE1 is the point equidistant from the first corner CO1 and the second corner CO2 on the side connecting the first corner CO1 and the second corner CO2. The second midpoint SE2 is the point equidistant from the second corner CO2 and the third corner CO3 on the side connecting the second corner CO2 and the third corner CO3. The third midpoint SE3 is the point equidistant from the third corner CO3 and the fourth corner CO4 on the side connecting the third corner CO3 and the fourth corner CO4. The fourth midpoint SE4 is the point equidistant from the fourth corner CO4 and the first corner CO1 on the side connecting the fourth corner CO4 and the first corner CO1.

In the distribution illustrated in FIG. 11, in the low leak region LLA, the more the position of the sub pixel close to the outer circumference of the display region, the larger the light blocking area of the thin film transistor is. The luminance change at the border between the low leak region LLA and the high leak region HLA along the horizontal direction is, thus, reduced. The distribution illustrated in FIG. 11 is effective when the holding ratio of the liquid crystal at each side section (the first side section SEA1, the second side section SEA2, the third side section SEA3, and the fourth side section SEA4) of the display region 110A is larger than that of the liquid crystal at the central section CE.

The light blocking area of the thin film transistor near each of the second midpoint SE2 and the fourth midpoint SE4 is smaller than that of the thin film transistor near each of the first corner CO1 and third corner CO3 illustrated in FIG. 10. The light blocking area of the thin film transistor near the midpoint of each side (the first midpoint SE1, the second midpoint SE2, the third midpoint SE3, and the fourth midpoint SE4) of the display region is smaller than that of the thin film transistor near each corner (the first corner CO1, the second corner CO2, the third corner CO3, and the fourth corner CO4) of the display region, although those relations are not illustrated. In the distribution of the light blocking area along each side of the display region, the light blocking area is minimum near the midpoint and as the position of the sub pixel is nearer the corner from the midpoint, the light blocking area is increased.

In this structure, the light blocking area near the midpoint where the holding ability of the liquid crystal is relatively high in the low leak region LLA is smaller than that at the corner section where the holding ability of the liquid crystal is the lowest. As a result, the luminance change in the low leak region is also reduced, thereby further enhancing display quality.

The following describes the operations and effects of the liquid crystal display device 100 in the embodiment.

Figure 12:
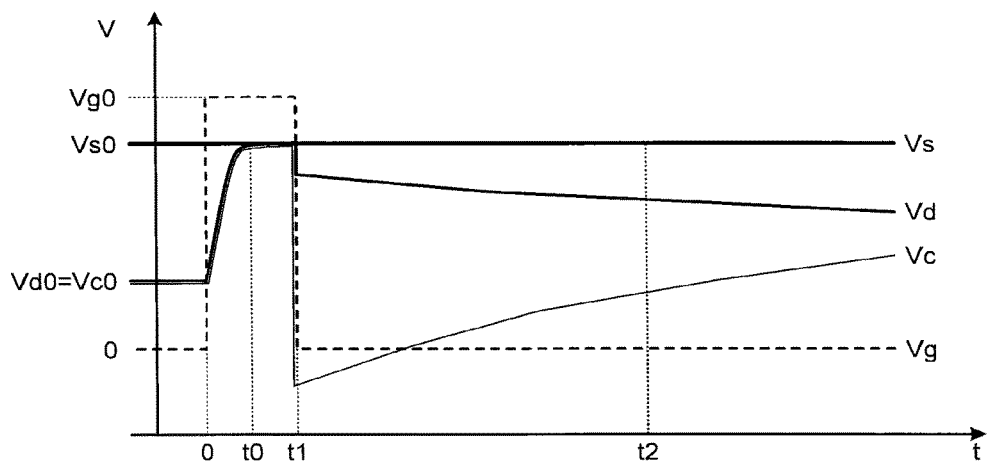
FIG. 12 is a schematic diagram illustrating a temporal change in potential of a source electrode, potential of a drain electrode, potential of a channel section, and potential of a gate electrode of a first thin film transistor.
Figure 13:
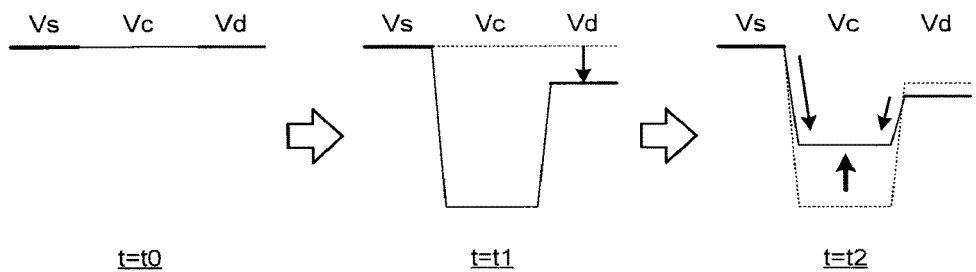
FIG. 13 is a schematic diagram explaining an occurrence mechanism of the transient leak current generated during an off period.
Figure 14:
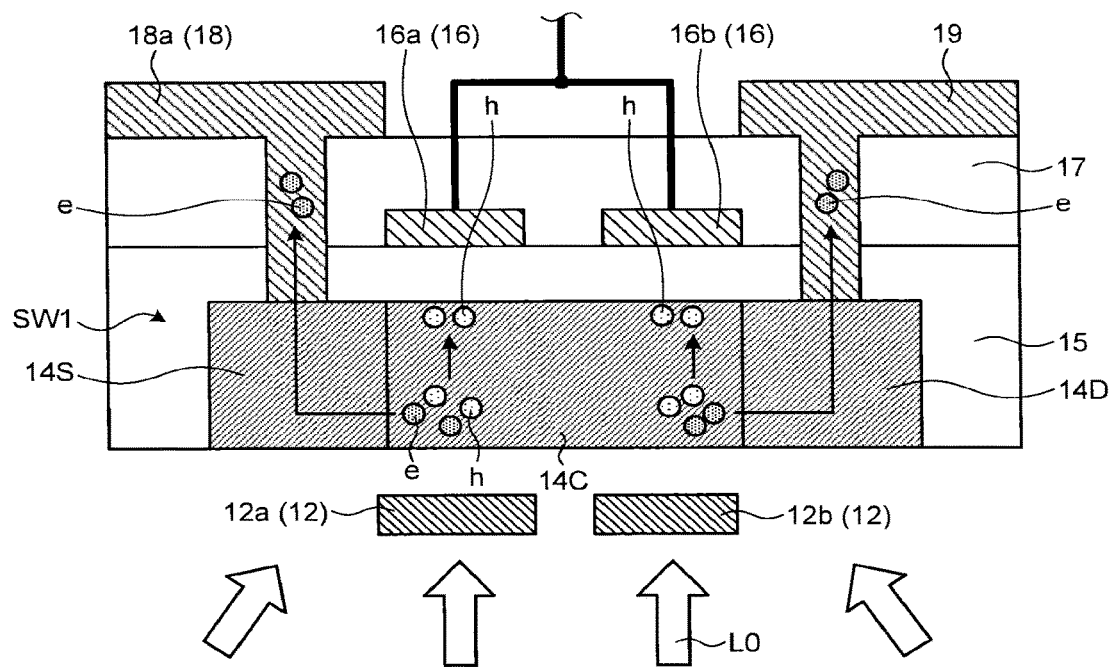
FIG. 14 is a schematic diagram illustrating the transient leak current of the first thin film transistor.
Figure 15:
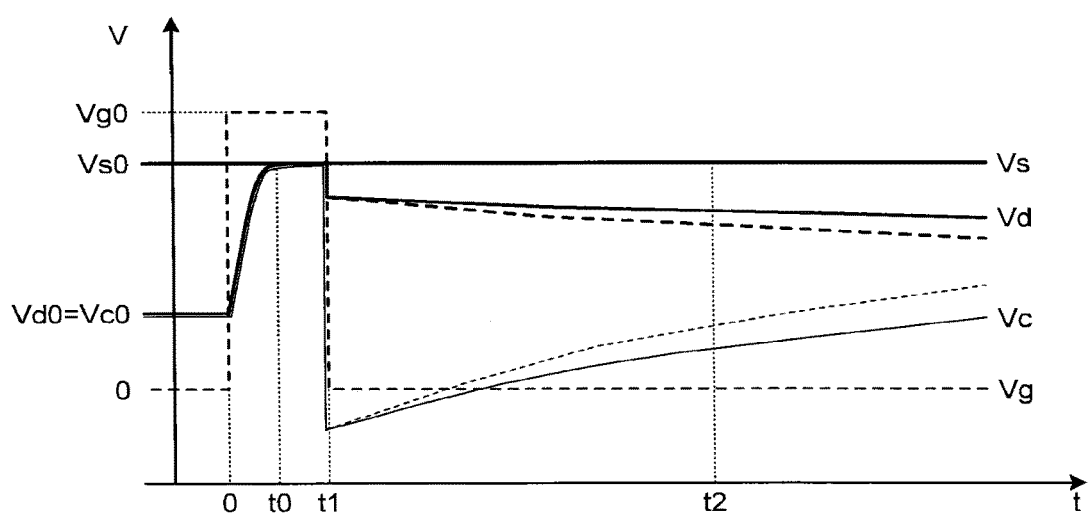
FIG. 15 is a schematic diagram illustrating a temporal change in potential of the source electrode, potential of the drain electrode, potential of the channel section, and potential of the gate electrode of a second thin film transistor.
Figure 16:
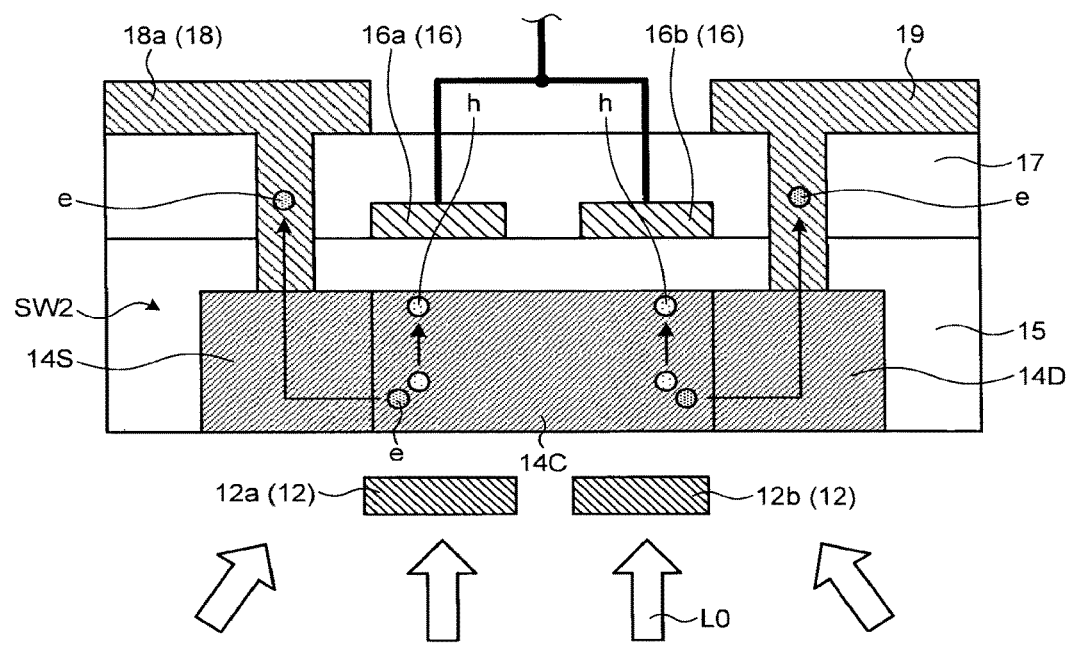
FIG. 16 is a schematic diagram illustrating the transient leak current of the second thin film transistor.

FIG. 12 is a schematic diagram illustrating a temporal change in the potential Vs of the source electrode, potential Vd of the drain electrode, potential Vc of the channel section, and the potential Vg of the gate electrode of the first thin film transistor SW1. FIG. 13 is a schematic diagram explaining an occurrence mechanism of the transient leak current generated during the off period. FIG. 14 is a schematic diagram illustrating the transient leak current of the first thin film transistor SW1. FIG. 15 is a schematic diagram illustrating a temporal change in the potential Vs of the source electrode, the potential Vd of the drain electrode, the potential Vc of the channel section, and the potential Vg of the gate electrode of the second thin film transistor SW2. FIG. 16 is a schematic diagram illustrating the transient leak current of the second thin film transistor SW2.

As illustrated in FIG. 12 through FIG. 14, upon supply of a gate signal (on voltage Vg0) to the gate electrode of the first thin film transistor SW1 at time 0, the potential Vc of the channel section 14C is increased from potential Vc0 and the potential Vd of the drain electrode 19 is increased from Vd0 (Vc0=Vd0), and each potential reaches a substantially constant value at time t0 before the end of the supply of the gate signal. Just before time t1 at which the supply of the gate signal ends (just before the start of the off period), the potential Vs of the source electrode 18a, the potential Vc of the channel section 14C, and the potential Vd of the drain electrode 19 are equal to one another, and are equal to potential Vs0 of the video signal supplied from the signal line 18.

Upon the end of the supply of the gate signal at time t1, the potential Vc of the channel section 14C just below the gate electrode is markedly reduced due to capacity coupling. The potential of the drain electrode 19, to which the pixel capacitance Cs (refer to FIG. 2) having a large value is coupled, is reduced as time elapses due to capacity coupling. The potential Vs of the source electrode 18a is not reduced because the potential Vs is fixed to the potential of the video signal supplied from the signal line 18.

During the off period (from time t1 onward), the transient leak current flows between the semiconductor layer 14 and the drain electrode 19, thereby causing a voltage applied to the liquid crystal layer to be changed. The transient leak current is generated by electrons e and holes h generated at the border between the source section 14S and the channel section 14C or at the border between the channel section 14C and the drain section 14D due to the influence of illumination light L0 or heat from the backlight.

The channel section 14C is charged by the transient leak current, resulting in the potential Vc of the channel section 14C being increased. The transient leak current at the border between the channel section 14C and the drain section 14D is considered as charge reallocation between the channel section 14C and the drain section 14D. With the increase in potential Vc of the channel section 14C, the potential vd of the drain electrode 19 is, thus, slightly decreased. The change of the potential Vd of the drain electrode 19 causes the voltage applied to the liquid crystal layer to be changed, resulting in the occurrence of the flicker.

As illustrated in FIGS. 15 and 16, the transient leak current is generated also in the second thin film transistor SW2 just after the start of the off period. In the second thin film transistor SW2, the transient leak current is small because the light blocking layer 12 is larger than that in the first thin film transistor SW1. As a result, the change ratio of the potential Vd of the drain electrode 19 is smaller than that of the first thin film transistor SW1. In FIG. 15, the bold broken line depicted below the curve representing the temporal change in the potential Vd is the same as the curve representing the temporal change in the potential Vd illustrated in FIG. 12 while the thin broken line depicted above the curve representing the temporal change in the potential Vc is the same as the curve representing the temporal change in the potential Vc illustrated in FIG. 12. FIG. 15 illustrates those curves together for the comparison purpose.

Figure 17:
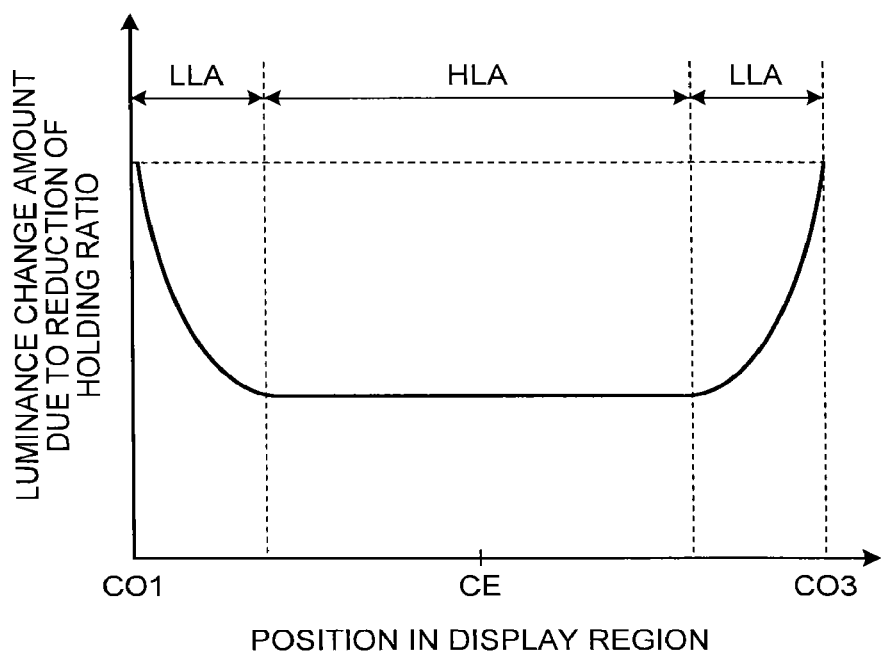
FIG. 17 is a schematic diagram illustrating an exemplary distribution of a luminance change amount of the sub pixel due to the reduction of the holding ratio of a liquid crystal layer.
Figure 18:
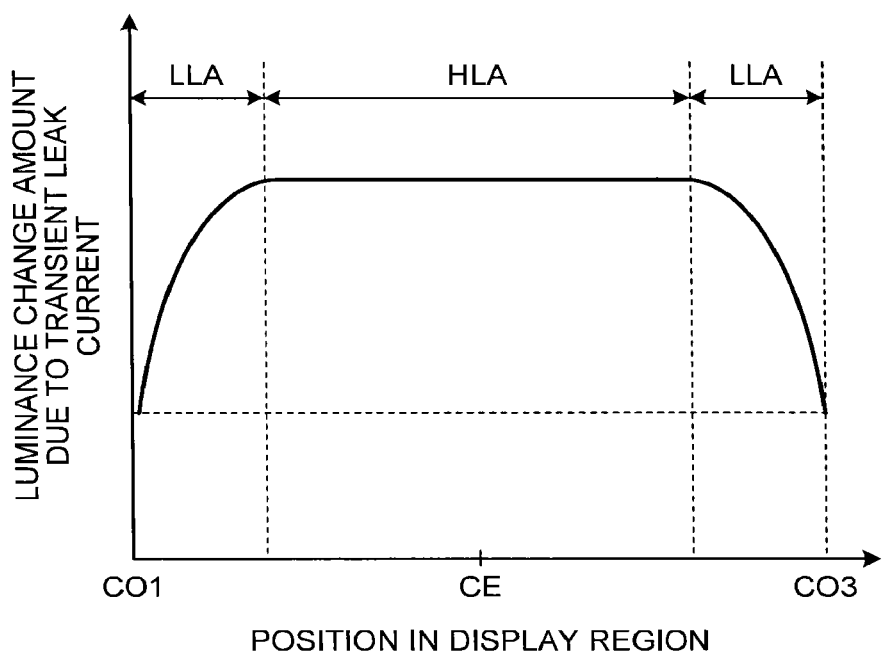
FIG. 18 is a schematic diagram illustrating an exemplary distribution of the luminance change amount of the sub pixel due to the transient leak current.

FIG. 17 is a schematic diagram illustrating an exemplary distribution of a luminance change amount of the sub pixel due to the reduction of the holding ratio of the liquid crystal layer. FIG. 18 is a schematic diagram illustrating an exemplary distribution of a luminance change amount of the sub pixel due to the transient leak current. FIGS. 17 and 18 each illustrates the distribution of the luminance change amount in the diagonal direction of the display region 110A illustrated in each of FIGS. 6 and 7.

As illustrated in FIG. 17, the reduction of the holding ratio of the liquid crystal layer increases toward the end of the display region 110A, which is near the seal material. In the central portion of the display region 110A, the holding ratio is substantially constant. The luminance change amount of the sub pixel due to the reduction of the holding ratio of the liquid crystal layer is, thus, large in the low leak region LLA in which the second thin film transistors SW2 are arranged and substantially constant in the high leak region HLA. The holding ratio decreases toward the outer circumference of the display region 110A. The luminance change amount of the sub pixel, thus, increases toward the outer circumference of the display region 110A.

As illustrated in FIG. 10, the light blocking area in the low leak region LLA is larger than that in the high leak region HLA. Hence, as illustrated in FIG. 18, the luminance change amount of the sub pixel due to the transient leak current in the low leak region LLA is smaller than that in the high leak region HLA. The light blocking area increases toward the outer circumference of the display region 110A. The luminance change amount of the sub pixel, thus, decreases toward the outer circumference of the display region 110A.

The liquid crystal display device 100 in the embodiment makes it possible for the sub pixel PX in the low leak region LLA to have the luminance change amount substantially similar to that of the sub pixel in the high leak region HLA. The distribution of the light blocking area illustrated in FIG. 11 is employed when the distribution of the luminance change amount similar to that illustrated in FIG. 17 is achieved at each side section (the first side section SEA1, the second side section SEA2, the third side section SEA3, and the fourth side section SEA4) of the display region 110A, although the distribution achieved at each side section is not illustrated.

If the light blocking areas of all of the thin film transistors SW provided in the display region 110A are sufficiently large, the occurrence of the flicker can be reduced. The design that employs the distribution of the area of the light blocking layer 12 in the display region 110A, such as that in the embodiment, can reduce the occurrence of the flicker at the end portion of the display region 110A while maintaining the aperture ratio.

The liquid crystal display device 100 according to the embodiment includes the low leak region LLA at the end portion of the display region 110A. The liquid crystal display device 100 can, thus, reduce the occurrence of the flicker at the end portion of the display region 110A, where the holding ability of liquid crystal is relatively low.

The shape of the display region 110A is not limited to a polygonal shape. The shape of the display region 110A may be a shape having a curve such as an elliptical shape or a circular shape. In this case, the central portion including the center serving as the center of gravity of the display region 110A is the high leak region HLA. The low leak region LLA is provided to the region that includes the end of the display region 110A, which is disposed on the line passing through the center of the display region 110A. It is preferable that the low leak region LLA be provided to the region including both ends of the display region 110A, which are arranged on the line passing through the center of the display region 110A. It is preferable that the sub pixel PX located farthest from the center of the display region 110A is included in the low leak region LLA.

In the embodiment, the transient leak current of each thin film transistor included in at least the sub pixels PX at both ends of the display region 110A among the plurality of the sub pixels PX provided on the lines passing through the center of the display region 110A in plan view is smaller than that of each thin film transistor included in the sub pixels PX in the central section CE including the center. The transient leak current is controlled by the light blocking area, for example. The light blocking area of each of the sub pixels PX at both ends of the display region 110A among the plurality of the sub pixels PX provided on the lines passing through the center of the display region 110A in plan view is larger than that of each of the sub pixels PX in the central section CE including the center. When the display region 110A is shaped in a shape having corner sections, it is preferable that the sub pixels PX each including the thin film transistor having a transient leak current smaller than that of each thin film transistor included in the sub pixels PX located at the center section CE are arranged in the corner sections including both ends of the display region 110A.

Second Embodiment

Figure 19:
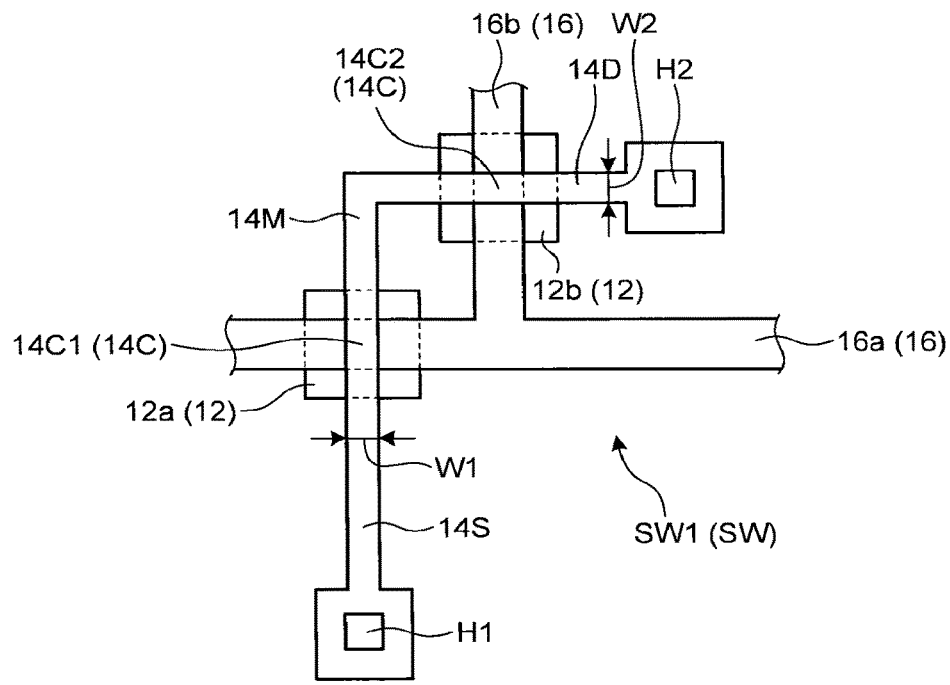
FIG. 19 is a schematic diagram illustrating the first thin film transistor according to a second embodiment.
Figure 20:
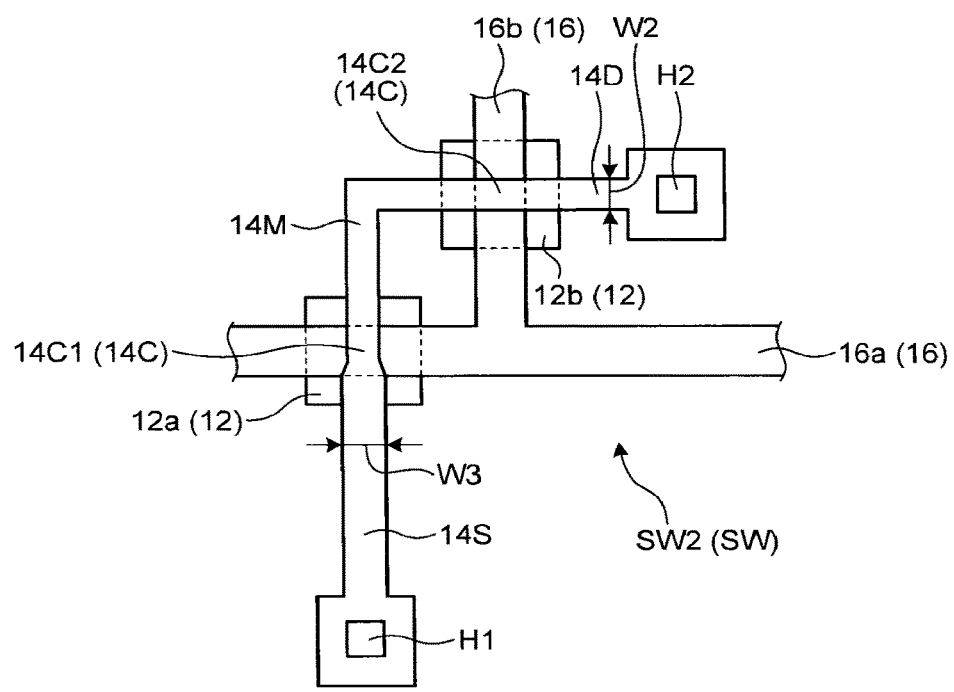
FIG. 20 is a schematic diagram illustrating the second thin film transistor according to the second embodiment.

FIG. 19 is a schematic diagram illustrating the first thin film transistor SW1 in a liquid crystal display device according to a second embodiment. FIG. 20 is a schematic diagram illustrating the second thin film transistor SW2 in the liquid crystal display device according to the second embodiment. In the second embodiment, the same structures as in the first embodiment are labeled with the same reference numerals, and detailed descriptions thereof are, thus, omitted.

The second embodiment differs from the first embodiment in that the value of the transient leak current of the thin film transistor is adjusted by electric resistance of the source section 14S or the drain section 14D. The electric resistance of the source section 14S is the electrical resistance of a current flowing from the source electrode to the region that faces the gate electrode in the semiconductor layer 14 while the electric resistance of the drain section 14D is the electrical resistance of a current flowing from the drain electrode to the region that faces the gate electrode in the semiconductor layer 14.

Letting the ratio (Rs/Rd) of an electrical resistance Rs of the source section 14S of the semiconductor layer 14 and an electrical resistance Rd of the drain section 14D of the semiconductor layer 14 denote a source drain resistance ratio of the thin film transistor SW, the source drain resistance ratio of the second thin film transistor SW2 provided in the low leak region is smaller than that of the first thin film transistor SW1 provided in the high leak region. For example, a width W3 of the source section 14S of the second thin film transistor SW2 provided in the low leak region is larger than a width W1 of the source section 14S of the first thin film transistor SW1 provided in the high leak region. A width W2 of the drain section 14D of the second thin film transistor SW2 provided in the low leak region is equal to a width W2 of the drain section 14D of the first thin film transistor SW1 provided in the high leak region.

The width (W1 or W3) of the source section 14S is the width of the source section 14S at the intersection between the edge of the first light blocking layer 12a and the source section 14S. The width (W2) of the drain section 14D is the width of the drain section 14D at the intersection between the edge of the second light blocking layer 12b and the drain section 14D. In FIGS. 19 and 20, W1, W2, and W3 are located at the positions shifted from the positions of the respective edges of the light blocking layers for clear illustration.

In the embodiment, the source drain resistance ratio is controlled by enlarging the width of the source section 14S (reducing the electrical resistance of the source section 14S) of the second thin film transistor SW2. The way to control the source drain resistance ratio is not limited to this manner. For example, the source drain resistance ratio may be controlled by adjusting the length and/or the impurity concentration of the source section 14S. The source drain resistance ratio may be controlled by adjusting the width, the length, and/or the impurity concentration of the drain section 14D.

Figure 21:
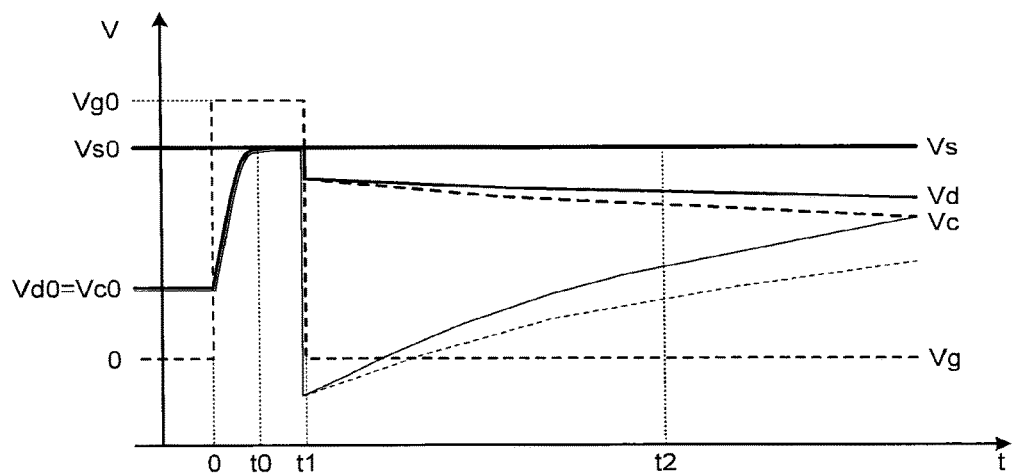
FIG. 21 is a schematic diagram illustrating a temporal change in potential of the source electrode, potential of the drain electrode, potential of the channel section, and potential of the gate electrode of the second thin film transistor.
Figure 22:
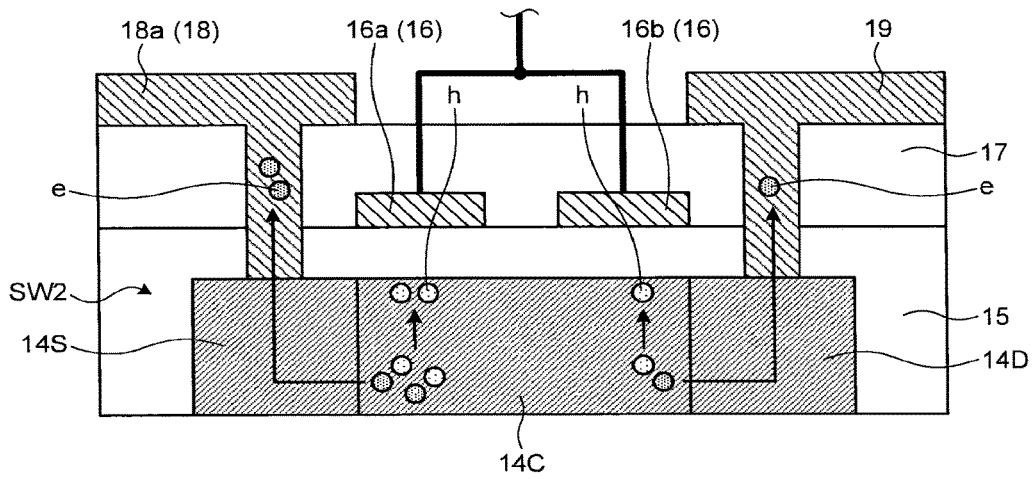
FIG. 22 is a schematic diagram illustrating the transient leak current of the second thin film transistor.

FIG. 21 is a schematic diagram illustrating a temporal change in the potential Vs of the source electrode, the potential Vd of the drain electrode, the potential Vc of the channel section, and the potential Vg of the gate electrode of the second thin film transistor SW2. FIG. 22 is a schematic diagram illustrating the transient leak current of the second thin film transistor SW2. In FIG. 21, the bold broken line depicted below the curve representing the temporal change in the potential Vd is the same as the curve representing the temporal change in the potential Vd illustrated in FIG. 12 while the thin broken line depicted above the curve representing the temporal change in the potential Vc is the same as the curve representing the temporal change in the potential Vc illustrated in FIG. 12. FIG. 21 illustrates those curves together for the comparison purpose.

The transient leak current of the first thin film transistor SW1 is the same as that described with reference to FIG. 12 through FIG. 14. The source drain resistance ratio of the second thin film transistor SW2 is smaller than that of the first thin film transistor SW1. The transient leak current generated at the border between the source section 14S and the channel section 14C during the off period in the second thin film transistor SW2 is larger than that in the first thin film transistor SW1. The channel section 14C is, thus, charged faster, resulting in the potential Vc of the channel section 14C being increased faster. The potential difference between the channel section 14C and the drain section 14D is, thus, reduced faster than that in the first thin film transistor SW1, resulting in the transient leak current between the channel section 14C and the drain section 14D being smaller than that in the first thin film transistor SW1. As a result, the temporal change ratio of the potential Vd of the drain electrode 19 is smaller than that of the first thin film transistor SW1.

As described above, in the embodiment, the source drain resistance ratio, which is the electrical resistance ratio of the source section to the drain section of the semiconductor layer, in the low leak region is smaller than that in the high leak region. In the low leak region, the transient leak current generated at the border between the source section 14S and the channel section 14C is larger than that generated at the border between the drain section 14D and the channel section 14C. As a result, the potential change in the drain electrode 19 is reduced. The mechanism of reduction of the potential change in the drain electrode 19 differs from that in the first embodiment. The second embodiment can, however, achieve the same effects as in the first embodiment. The second embodiment can also provide the liquid crystal display device having little flicker.

If the widths of the source sections 14S of all of the thin film transistors SW provided in the display region 110A are sufficiently large, the occurrence of the flicker can be reduced. The design that employs the distribution of the width of the source section 14S in the display region 110A, such as that in the embodiment, can reduce the occurrence of the flicker at the end portion of the display region 110A while maintaining the aperture ratio. In the embodiment, the low leak region LLA is provided at the end portion of the display region 110A, and the transient leak current of each thin film transistor included in at least the sub pixels PX at both ends of the display region 110A among the plurality of the sub pixels PX provided on the lines passing through the center of the display region 110A in plan view is smaller than that of each thin film transistor included in the sub pixels PX in the central section CE including the center. In the embodiment, the transient leak current is controlled by the source drain resistance ratio of the semiconductor layer 14. The source drain resistance ratio of the semiconductor layer 14 of each of the sub pixels PX at both ends of the display region 110A among the multiple sub pixels PX provided on the lines passing through the center of the display region 110A in plan view is smaller than that of each of the sub pixels PX in the central section CE including the center.

Third Embodiment

Figure 23:
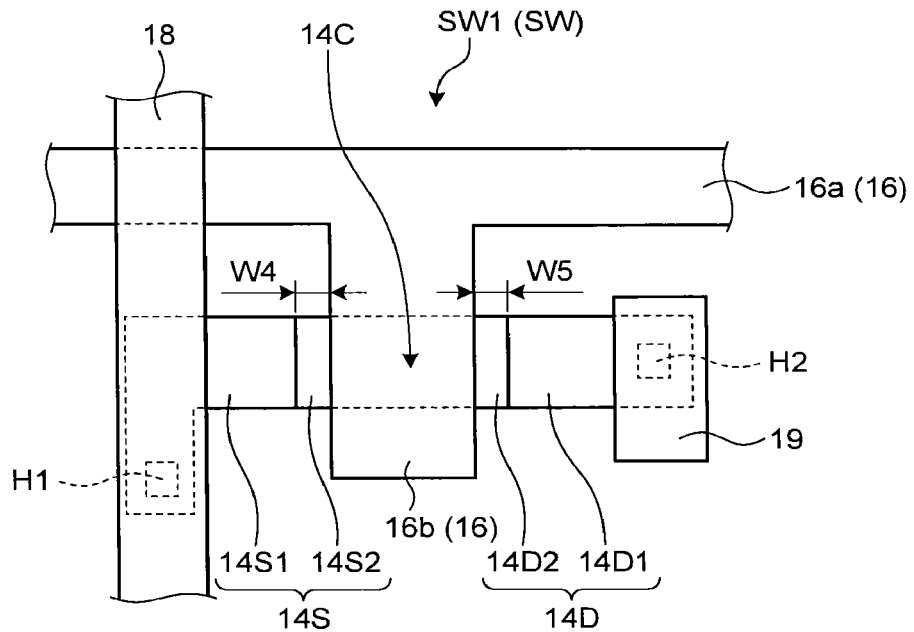
FIG. 23 is a schematic diagram illustrating the first thin film transistor according to a third embodiment.
Figure 24:
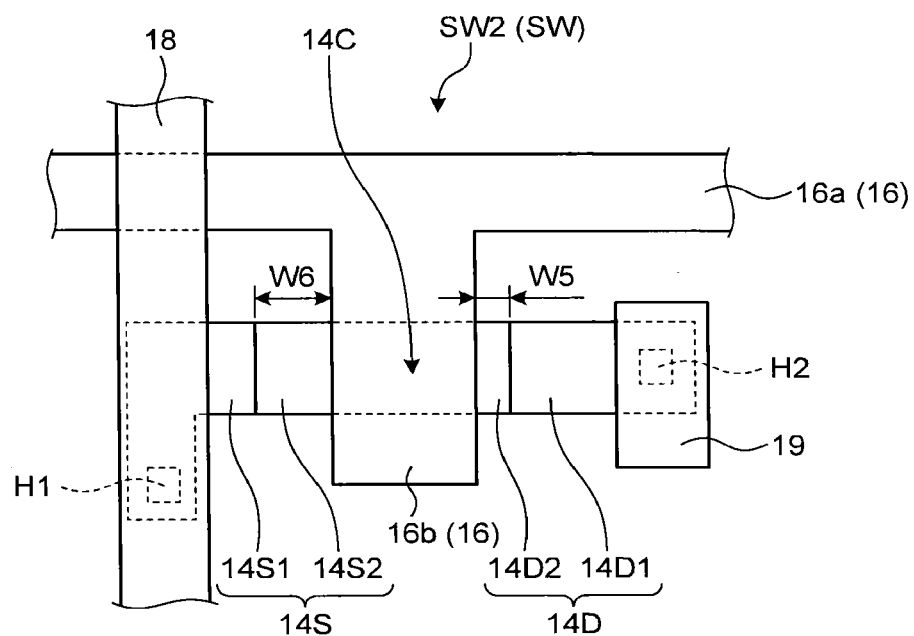
FIG. 24 is a schematic diagram illustrating the second thin film transistor according to the third embodiment.

FIG. 23 is a schematic diagram illustrating the first thin film transistor SW1 in a liquid crystal display device according to a third embodiment. FIG. 24 is a schematic diagram illustrating the second thin film transistor SW2 in the liquid crystal display device according to the third embodiment. In the third embodiment, the same structures as in the second embodiment are labeled with the same reference numerals, and detailed descriptions thereof are, thus, omitted.

The third embodiment differs from the second embodiment in that the thin film transistor SW has a lightly doped drain (LDD) structure, the thin film transistor SW has a single gate structure, and the size of the transient leak current of the thin film transistor SW is adjusted by the length of the lightly doped impurity region of the source section 14S (by a difference in LDD structure). The length of the lightly doped impurity region means the length in the direction from the source electrode or the drain electrode toward the channel section 14C.

In the source section 14S, a lightly doped impurity region 14S2 is provided on a side near the channel section 14C and a highly doped impurity region 14S1 is provided on a side far from the channel section 14C. In the drain section 14D, a lightly doped impurity region 14D2 is provided on a side near the channel section 14C and a highly doped impurity region 14D1 is provided on a side far from the channel section 14C.

A length W6 of the lightly doped impurity region 14S2 in the source section 14S of the second thin film transistor SW2 is longer than a length W4 of the lightly doped impurity region 14S2 in the source section 14S of the first thin film transistor SW1. A length W5 of the lightly doped impurity region 14D2 in the drain section 14D of the second thin film transistor SW2 is equal to a length W5 of the lightly doped impurity region 14D2 in the drain section 14D of the first thin film transistor SW1.

As the length of the lightly doped impurity region 14S2 in the source section 14S is increased, the absorption amount of illumination light from the backlight is increased. The transient leak current generated at the border between the channel section 14C and the source section 14S is, thus, increased, thereby reducing the potential change in the drain electrode 19. The mechanism of reduction of the potential change in the drain electrode 19 differs from that in the second embodiment. The third embodiment can, however, achieve the same effects as in the second embodiment. The third embodiment can also provide the liquid crystal display device having little flicker.

Fourth Embodiment

Figure 25:
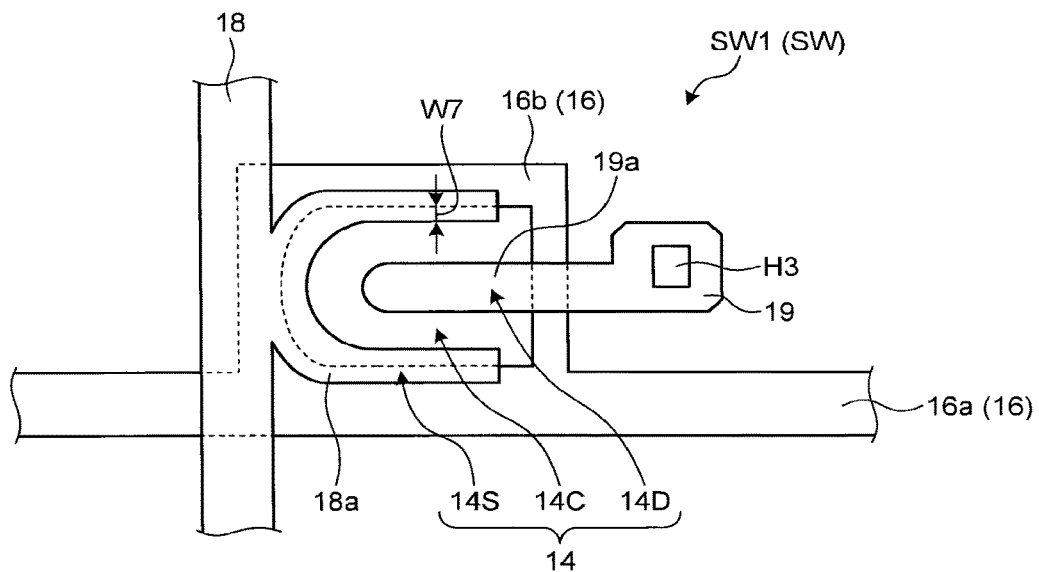
FIG. 25 is a schematic diagram illustrating the first thin film transistor according to a fourth embodiment.
Figure 26:
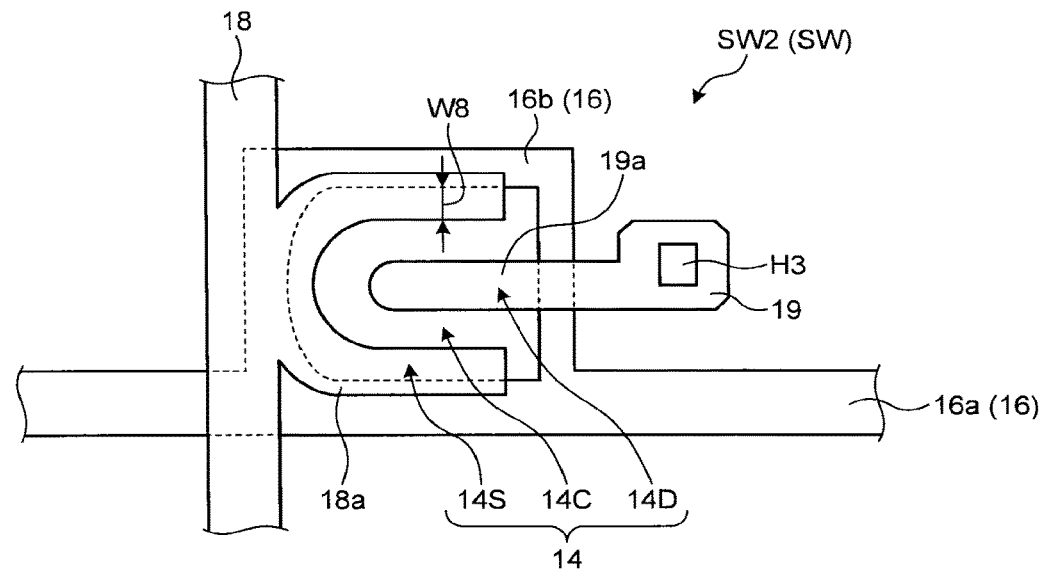
FIG. 26 is a schematic diagram illustrating the second thin film transistor according to the fourth embodiment.
Figure 27:
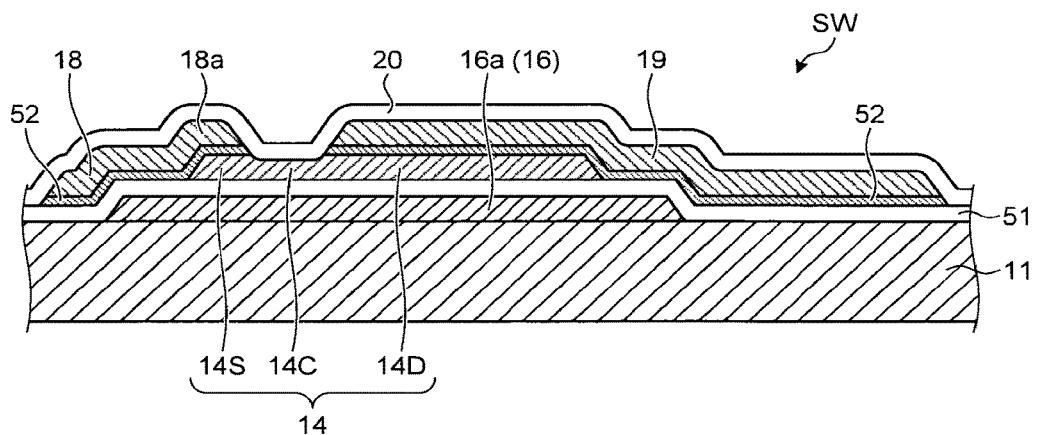
FIG. 27 is a cross sectional view of the thin film transistor.

FIG. 25 is a schematic diagram illustrating the first thin film transistor SW1 in a liquid crystal display device according to a fourth embodiment. FIG. 26 is a schematic diagram illustrating the second thin film transistor SW2 in the liquid crystal display device according to the fourth embodiment. FIG. 27 is a cross sectional view of the thin film transistor SW. In the fourth embodiment, the same structures as in the second embodiment are labeled with the same reference numerals, and detailed descriptions thereof are, thus, omitted.

The fourth embodiment differs from the second embodiment in that the thin film transistor SW has the single gate structure, and the source drain resistance ratio of the thin film transistor SW is adjusted by the areas of a region where the source section 14S of the semiconductor layer 14 overlaps with the source electrode 18a and a region where the drain section 14D of the semiconductor layer 14 overlaps with the drain electrode 19.

As illustrated in FIG. 25, the semiconductor layer 14 is formed partially in the region where the branched section 16b is formed. The branched section 16b is formed with an area larger than that of the semiconductor layer 14 and is disposed so as to cover the whole of the backlight side of the semiconductor layer 14. The branched section 16b serves as the light blocking layer. Another layer (light blocking layer) having the light blocking function may be provided at the lower layer (the layer on the backlight 120 side) of the branched section 16b. The branched section 16b overlapped with the semiconductor layer 14 serves as the gate electrode of the thin film transistor SW. The source electrode 18a and the drain electrode 19 of the thin film transistor SW overlap with the semiconductor layer 14 in the region where the semiconductor layer 14 and the branched section 16*b* (the gate electrode of the thin film transistor SW) overlap with each other.

The source electrode 18*a* branches from the signal line 18 and extends toward the semiconductor layer 14 side. The semiconductor layer 14 has a bombshell-like shape composed of three straight sides and one curved side. The semiconductor layer 14 is disposed such that the curved side faces the signal line 18. The source electrode 18*a* is formed in a U shape along the one curved side and the two sides adjacent to the one side of the semiconductor layer 14. The drain electrode 19 includes a line section 19*a* that extends in parallel with the scan line 16. The line section 19*a* is placed in the region surrounded by the source electrode 18*a* in a U shape while a constant gap is kept between the line section 19*a* and the source electrode 18*a*.

The source electrode 18*a* and the line section 19*a* are layered above the semiconductor layer 14 with an ohmic contact layer 52 (refer to FIG. 27) interposed therebetween. The whole surfaces facing the semiconductor layer 14 of the source electrode 18*a* and the line section 19*a* are electrically coupled to the semiconductor layer 14 with the ohmic contact layer 52 interposed therebetween. The region of the semiconductor layer 14 that overlaps the source electrode 18*a* is the source section 14S. The region of the semiconductor 14 that overlaps the line section 19*a* (the drain electrode 19) is the drain section 14D. The region of the semiconductor 14 disposed between the source section 14S and the drain section 14D is the channel section 14C.

As illustrated in FIG. 27, the scan line 16 is formed on the first base 11. The gate insulating layer 51 is formed on and above the first base 11 while covering the scan line 16. The semiconductor layer 14 is formed on the gate insulating layer 51. The ohmic contact layer 52 is formed on and above the gate insulating layer 51 so as to cover the semiconductor layer 14. The source electrode 18*a*, the signal line 18, and the drain electrode 19 are laminated on the ohmic contact layer 52.

The ohmic contact layer 52 is an impurity semiconductor layer for achieving a good ohmic contact between the semiconductor layer 14 and both of the source electrode 18*a* and the drain electrode 19. The ohmic contact layer 52 is patterned together with the source electrode 18*a*, the signal line 18, and the drain electrode 19. The ohmic contact layer 52 is, thus, selectively formed in only the region where the source electrode 18*a*, the signal line 18, and the drain electrode 19 are formed.

Above the gate insulating layer 51, the third interlayer insulating layer 20 is formed so as to cover the semiconductor layer 14, the source electrode 18*a*, the signal line 18, and the drain electrode 19. The structure on the upper side (on a side where the liquid crystal layer is provided) of the third interlayer insulating layer 20 is the same as that illustrated in FIG. 4.

As illustrated in FIGS. 25 and 26, in the embodiment, the source drain resistance ratio of the thin film transistor SW is adjusted by the areas of the region where the source section 14S of the semiconductor layer 14 overlaps with the source electrode 18*a* and the region where the drain section 14D of the semiconductor layer 14 overlaps with the drain electrode 19. The larger the area of the source section 14S is, the smaller the electrical resistance of the source section 14S while the larger the area of the drain section 14D is, the smaller the electrical resistance of the drain section 14D is.

A width W8 of the source electrode 18*a* formed along the three sides of the semiconductor layer 14 of the second thin film transistor SW2 is larger than a width W7 of the source electrode 18*a* formed along the three sides of the semiconductor layer 14 of the first thin film transistor SW1. The area of the source section 14S of the second thin film transistor SW2 provided in the low leak region is, thus, larger than that of the source section 14S of the first thin film transistor SW1 provided in the high leak region. The area of the drain section 14D of the second thin film transistor SW2 is equal to that of the drain section 14D of the first thin film transistor SW1. As a result, the source drain resistance ratio of the second thin film transistor SW2 is smaller than that of the first thin film transistor SW1.

In the embodiment, the source drain resistance ratio is controlled by increasing the area of the source section 14S (reducing the electrical resistance of the source section 14S) of the second thin film transistor SW2. The way to control the source drain resistance ratio is not limited to this manner. For example, the source drain resistance ratio may be controlled by adjusting the impurity concentration of the source section 14S. The source drain resistance ratio may be controlled by adjusting the area or the impurity concentration of the drain section 14D.

The embodiment can also obtain the same effects as in the second embodiment. The fourth embodiment can also provide the liquid crystal display device having little flicker.

Fifth Embodiment

Figure 28:
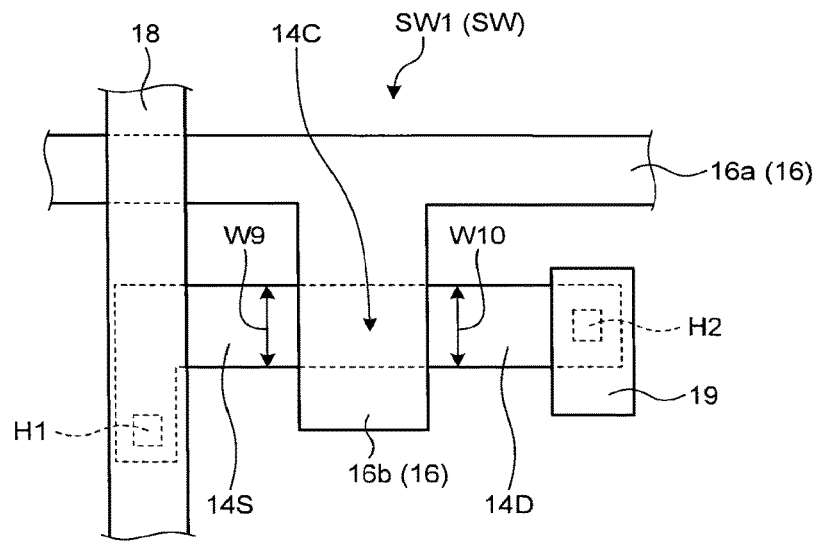
FIG. 28 is a schematic diagram illustrating the first thin film transistor according to a fifth embodiment.
Figure 29:
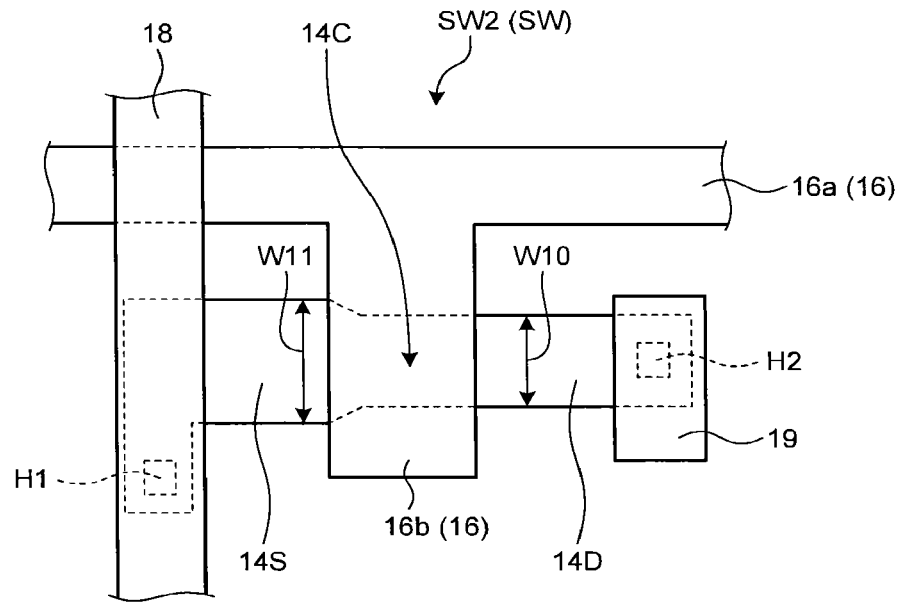
FIG. 29 is a schematic diagram illustrating the second thin film transistor according to the fifth embodiment.

FIG. 28 is a schematic diagram illustrating the first thin film transistor SW1 in a liquid crystal display device according to a fifth embodiment. FIG. 29 is a schematic diagram illustrating the second thin film transistor SW2 in the liquid crystal display device according to the fifth embodiment. In the fifth embodiment, the same structures as in the third embodiment are labeled with the same reference numerals, and detailed descriptions thereof are, thus, omitted.

The fifth embodiment differs from the third embodiment in that the thin film transistor SW does not have the LDD structure, the value of the transient leak current of the thin film transistor is adjusted by electric resistance of the source section 14S or the drain section 14D. The electric resistance of the source section 14S is the electrical resistance of a current flowing from the source electrode to the region of the semiconductor layer 14 that faces the gate electrode in the semiconductor layer 14 while the electric resistance of the drain section 14D is the electrical resistance of a current flowing from the drain electrode to the region of the semiconductor layer 14 that faces the gate electrode.

In the embodiment, a width W11 of the source section 14S of the second thin film transistor SW2 provided in the low leak region is larger than a width W9 of the source section 14S of the first thin film transistor SW1 provided in the high leak region, for example. A width W10 of the drain section 14D of the second thin film transistor SW2 provided in the low leak region is equal to a width W10 of the drain section 14D of the first thin film transistor SW1 provided in the high leak region. As a result, the source drain resistance ratio of the second thin film transistor SW2 provided in the low leak region is smaller than that of the first thin film transistor SW1 provided in the high leak region. The fifth embodiment, thus, provides the liquid crystal display device having little flicker.

The width (W9 or W11) of the source section 14S is the width of the source section 14S at the intersection between the edge of the gate electrode (the branched section 16*b*) and the source section 14S. The width (W10) of the drain section 14D is the width of the drain section 14D at the intersection between the edge of the gate electrode and the drain section 14D. In FIGS. 28 and 29, W9, W10, and W11 are located at the positions shifted from the positions of the respective edges of the gate electrode for clear illustration.

In the embodiment, the source drain resistance ratio is controlled by enlarging the width of the source section 14S (reducing the electrical resistance of the source section 14S) of the second thin film transistor SW2. The way to control the source drain resistance ratio is not limited to this manner. For example, the source drain resistance ratio may be controlled by adjusting the length and/or the impurity concentration of the source section 14S. The source drain resistance ratio may be controlled by adjusting the width, the length, and/or the impurity concentration of the drain section 14D.

Material of Liquid Crystal Layer

In the first through fourth embodiments, the liquid crystal layer 40 is made of a negative liquid crystal material having negative dielectric anisotropy. The liquid crystal material used satisfies the following conditions.

$$|\Delta\varepsilon| \leq 4.0 \quad (1)$$

$$\Delta n \leq 0.11 \quad (2)$$

$$\gamma 1 \geq 100 \text{ where } |\Delta\varepsilon|=3.5 \quad (3)$$

$\Delta\varepsilon$ represents the dielectric anisotropy of the liquid crystal material when the temperature of the liquid crystal material is 25° C. $\Delta$n represents refractive index anisotropy (at wavelength $\lambda$ is 589 nm) of the liquid crystal material when the temperature of the liquid crystal material is 25° C. $\gamma 1$ represents a rotation viscosity coefficient of the liquid crystal material when the temperature of the liquid crystal material is 20° C.

The use of the negative liquid crystal material easily causes the generation of the flicker when the low frequency driving or the intermittent driving is performed. The cause may be impedance mismatching due to the low resistivity of the liquid crystal material. Particularly in a high temperature environment, the occurrence of the flicker tends to increase. The inventor found a strong correlation between the physical property values of the liquid crystal material and a flicker level and thus conceived conditions (1) to (3) described above. The embodiment uses the liquid crystal material satisfying conditions (1) to (3), thereby making it possible to effectively reduce the flicker in a high temperature environment.

Figure 30:
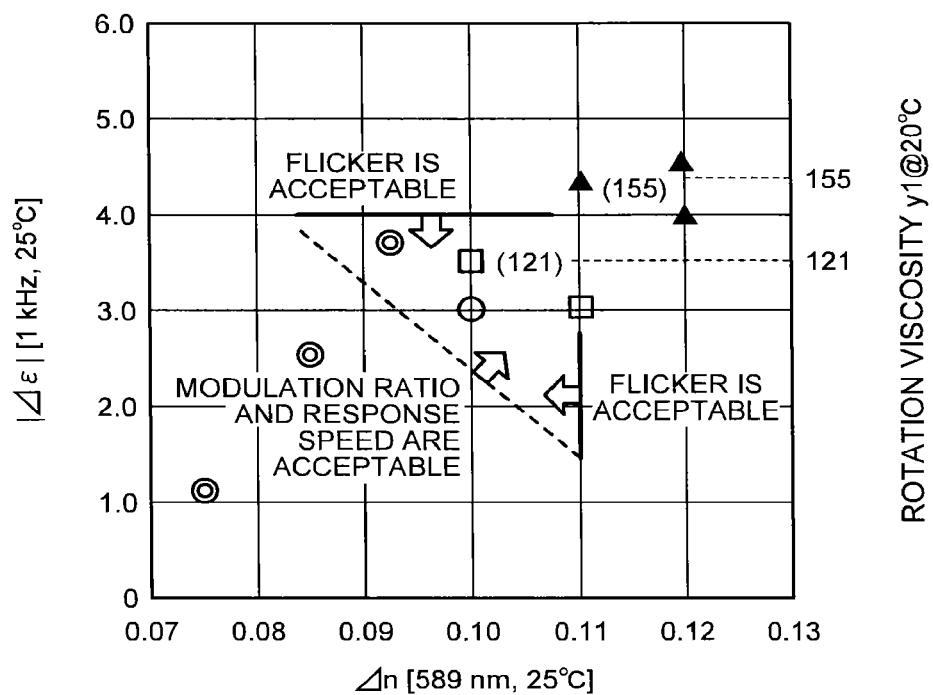
FIG. 30 is a schematic diagram illustrating a relation between the easiness of the generation of a flicker in a high temperature environment versus $\Delta\varepsilon$, $\Delta n$, and $\gamma 1$.
Figure 31:
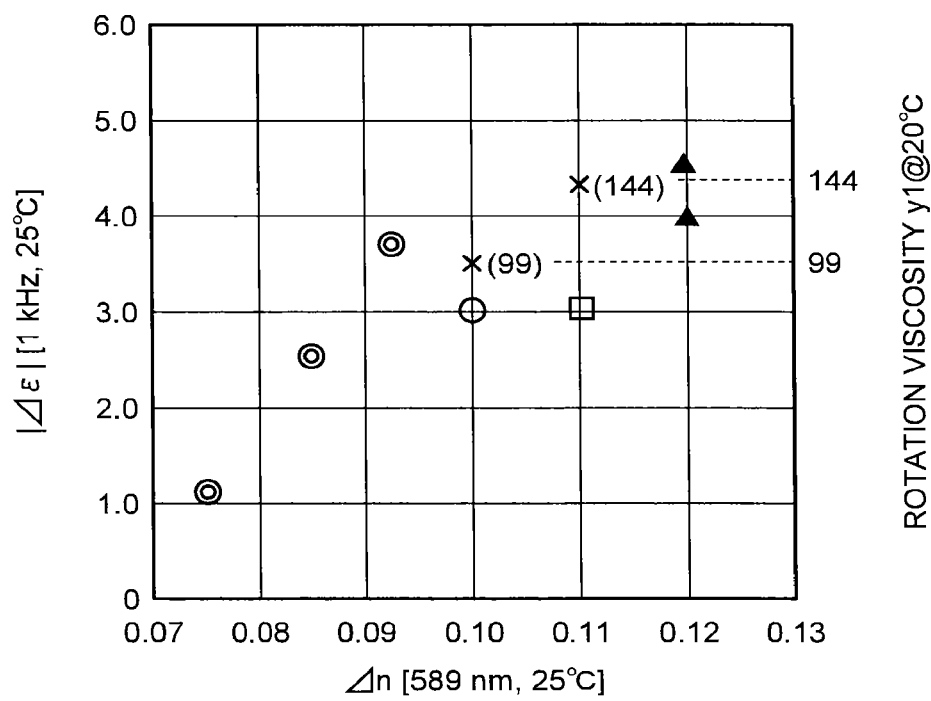
FIG. 31 is another schematic diagram illustrating the relation between the easiness of the generation of the flicker in a high temperature environment and $\Delta\varepsilon$, $\Delta n$, and $\gamma 1$.

FIGS. 30 and 31 are schematic diagrams illustrating the relation between the easiness of the generation of the flicker (the flicker level) in a high temperature environment versus $\Delta\varepsilon$, $\Delta$n, and $\gamma 1$. In FIGS. 30 and 31, "double circle", "circle", "square", "filled triangle", and "cross" symbols represent the flicker level from a low level (hard to generate the flicker) in this order.

The absolute value of the dielectric anisotropy $|\Delta\varepsilon|$ and the refractive index anisotropy $\Delta$n were found as the physical property values correlated to the flicker level. The experiment result (refer to FIG. 30) was obtained that as the values of both physical property values are reduced, the flicker level becomes lower (better). In addition, it was found that when the values of $|\Delta\varepsilon|$ and $\Delta$n are too small, a modulation ratio and a response speed, which are other characteristics than the flicker, deteriorate (refer to the broken line in FIG. 30). It was found that it is effective for achieving a good flicker characteristic at high temperatures to use the liquid crystal material satisfying conditions (1) and (2). In addition, it was found that the liquid crystal display device satisfying flicker, modulation ratio, and the response speed characteristics and employing the low frequency driving method can be achieved using the liquid crystal material having values of $|\Delta\varepsilon|$ and $\Delta$n limited to those determined by the broken line illustrated in FIG. 30.

From the inventor's experiment, it was found that the flicker characteristic deteriorates when the liquid crystal material having a small rotation viscosity coefficient $\gamma 1$ is used. For example, the flicker level was the level denoted by the cross symbol when the liquid crystal having $\gamma 1$ (20° C.) was 99 mPa·s where $\Delta$n was 0.1 and $|\Delta\varepsilon|$ was 3.5. For achieving a good flicker level, condition (3) was necessary. Because $\gamma 1$ depends on $|\Delta\varepsilon|$, condition (3) was specified when $|\Delta\varepsilon|$ was 3.5.

The present invention is not limited to the embodiments described above. The disclosed contents in the embodiments are examples. The embodiments can be changed in various ways without departing from the spirit of the invention. The appropriate changes performed without departing from the spirit of the invention also belong to the technical scope of the invention.

What is claimed is:

1. A liquid crystal display device, comprising:
    a display region that includes a plurality of sub pixels each including:
        a pixel electrode; and
        a thin film transistor electrically coupled to the pixel electrode, wherein
    a transient leak current is a current that flows through a semiconductor layer of the thin film transistor during an OFF period of the thin film transistor, and
    the transient leak current of each thin film transistor included in sub pixels, which are disposed at both ends of the display region among sub pixels, of the sub pixels, provided on a line passing through a center of the display region in a plan view is smaller than the transient leak current of each thin film transistor included in sub pixels, of the sub pixels, which are disposed in a central portion including the center.

2. The liquid crystal display device according to claim 1, further comprising a gate signal line which supplies a gate signal, wherein
    the gate signal turns ON a thin film transistor of the thin film transistors,
    the display region has a polygonal shape that has a long side and a pair of corners, one corner provided at a first end of the long side and the other corner provided at a second end of the long side,
    the long side extends along a first direction that is orthogonal to the gate signal line, and
    the sub pixels, each of which includes the thin film transistor having the transient leak current smaller than the transient leak current of each thin film transistor included in the sub pixels which are disposed in the central portion of the display region in the first direction, are disposed in corner sections including both ends of the display region.

3. The liquid crystal display device according to claim 2, further comprising:
    a low leak region that includes each corner section of the display region and in which sub pixels, of the sub pixels, are arranged; and
    a high leak region that includes the central portion and in which sub pixels, of the sub pixels, are arranged, the transient leak current of each thin film transistor included in the sub pixels arranged in the high leak region being larger than the transient leak current of each thin film transistor included in the sub pixels arranged in the low leak region.

4. The liquid crystal display device according to claim 3, wherein
a light blocking layer that overlaps with the semiconductor layer is provided,
a light blocking area of a thin film transistor provided in the low leak region is larger than a light blocking area of a thin film transistor provided in the high leak region, and
wherein each light blocking area is an area of a region where the light blocking layer overlaps with the semiconductor layer.

5. The liquid crystal display device according to claim 3, wherein
a source drain resistance ratio in the low leak region is smaller than a source drain resistance ratio in the high leak region, and
wherein each source drain resistance ratio is an electrical resistance ratio of a source section to a drain section of the semiconductor layer.

6. The liquid crystal display device according to claim 5, wherein a width of the source section of a thin film transistor provided in the low leak region is larger than a width of the source section of a thin film transistor provided in the high leak region.

7. The liquid crystal display device according to claim 5, wherein
a source electrode of the thin film transistor overlaps with the semiconductor layer in a region where the semiconductor layer and a gate electrode of the thin film transistor overlap with each other,
a region of the semiconductor layer that overlaps with the source electrode is the source section, and
an area of the source section of a thin film transistor provided in the low leak region is larger than an area of the source section of a thin film transistor provided in the high leak region.

8. The liquid crystal display device according to claim 3, wherein the low leak region is provided continuously to a whole circumference of the display region.

9. A liquid crystal display device, comprising: a display region that includes a plurality of sub pixels each including: a pixel electrode; a thin film transistor electrically coupled to the pixel electrode; and a light blocking layer, wherein the thin film transistor includes a semiconductor layer overlapping with the light blocking layer, a light blocking area in sub pixels, which are disposed at both ends of the display region among sub pixels, of the sub pixels, provided on a line passing through a center of the display region in a plan view is larger than a light blocking area in sub pixels, of the sub pixels, in a central portion including the center, and the light blocking area is an area of a region where the light blocking layer overlaps with the semiconductor layer, each of the sub pixels further includes a gate signal line provided along the pixel electrode, the gate signal line has a main line section and a branched section that branches from the main line section in a direction crossing the main line section, the light blocking layer includes a first separated light blocking layer that is disposed to overlap a crossing of the thin film transistor and the main line section; and a second separated light blocking layer that is disposed to overlap a crossing of the thin film transistor and the branched section, the light blocking area includes a first separated light blocking area corresponding to the first separated light blocking layer and a second separated light blocking area corresponding to the second separated light blocking layer, and a light blocking area that is a sum of the first separated light blocking area and the second separated light blocking area in respective sub pixels, which are disposed at both ends of the display region among sub pixels, of the sub pixels, provided on the line passing through the center of the display region in the plan view is larger than a light blocking area that is a sum of the first separated light blocking area and the second separated light blocking area in respective sub pixels, of the sub pixels, which are disposed in the central portion including the center.

10. The liquid crystal display device according to claim 1, wherein
the thin film transistor includes the semiconductor layer, a gate electrode, and a drain electrode,
the transient leak current is a current that flows between the semiconductor layer and the drain electrode during the OFF period, and
the OFF period is from an end of supplying a gate signal to the gate electrode before a restart of supplying the gate signal to the gate electrode.

* * * * *